(12) United States Patent
Boon

(10) Patent No.: US 7,116,829 B1
(45) Date of Patent: Oct. 3, 2006

(54) IMAGE CODING AND DECODING METHODS, IMAGE CODING AND DECODING APPARATUSES, AND RECORDING MEDIA FOR IMAGE CODING AND DECODING PROGRAMS

(75) Inventor: Choong Seng Boon, Moriguchi (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 165 days.

(21) Appl. No.: 10/392,827

(22) Filed: Mar. 21, 2003

Related U.S. Application Data

(63) Continuation of application No. 09/906,833, filed on Jul. 18, 2001, now Pat. No. 6,574,369, which is a continuation of application No. 09/091,985, filed on Aug. 11, 1998, now Pat. No. 6,345,123.

(30) Foreign Application Priority Data

| Nov. 6, 1996 | (JP) | ................................ 8-293512 |
| Mar. 17, 1997 | (JP) | ................................. 9-62649 |

(51) Int. Cl.
G06K 9/36 (2006.01)
G06K 9/46 (2006.01)

(52) U.S. Cl. ...................... 382/233; 382/245; 382/248

(58) Field of Classification Search ............... 382/233, 382/244, 245, 246, 248, 250; 358/426.13, 358/426.14; 341/65, 67, 59, 82
See application file for complete search history.

(56) References Cited

U.S. PATENT DOCUMENTS

| 4,939,583 | A | 7/1990 | Tsuboi et al. ............ 358/261.1 |
| 5,384,644 | A | 1/1995 | Yamagami .................. 358/426 |
| 5,400,075 | A | 3/1995 | Savatier ...................... 348/384 |
| 5,563,593 | A | 10/1996 | Puri ............................. 341/87 |
| 5,729,690 | A | 3/1998 | Jeong et al. ................ 395/200 |
| 6,349,149 | B1 | 2/2002 | Boon ......................... 382/233 |
| 6,404,929 | B1* | 6/2002 | Boon ......................... 382/233 |
| 6,574,369 | B1* | 6/2003 | Boon ......................... 382/233 |

FOREIGN PATENT DOCUMENTS

| EP | 0 595 242 A2 | 5/1994 |
| EP | 0 873 018 | 10/1998 |
| EP | 0 663 773 B1 | 3/2000 |
| EP | 0 692 913 B1 | 10/2001 |
| JP | 6-237184 | 8/1994 |
| JP | 6-311534 | 11/1994 |
| JP | 8-79088 | 3/1996 |
| JP | 2000216154 | 11/2000 |
| JP | 2000316153 | 11/2000 |
| WO | WO 95/17073 | 6/1995 |
| WO | WO 98/20681 | 5/1998 |

OTHER PUBLICATIONS

Gonzalez et al., "Digital Image Processing." pp. 396-402, Jun. 1992.

\* cited by examiner

Primary Examiner—Phuoc Tran
(74) Attorney, Agent, or Firm—Steptoe & Johnson LLP

(57) ABSTRACT

In an image coding method of the present invention, after a process such as DCT is performed to digital image data, quantization process is performed, and then, to resultant quantized transform coefficients, variable length coding process is performed with reference to a variable length code table showing how variable length codes are allocated, and in a comparison process between an event derived from the quantized transform coefficients and a reference event included in the variable length code table, transformation process is performed to increase a possibility of performing variable length coding with satisfactory coding efficiency.

4 Claims, 22 Drawing Sheets

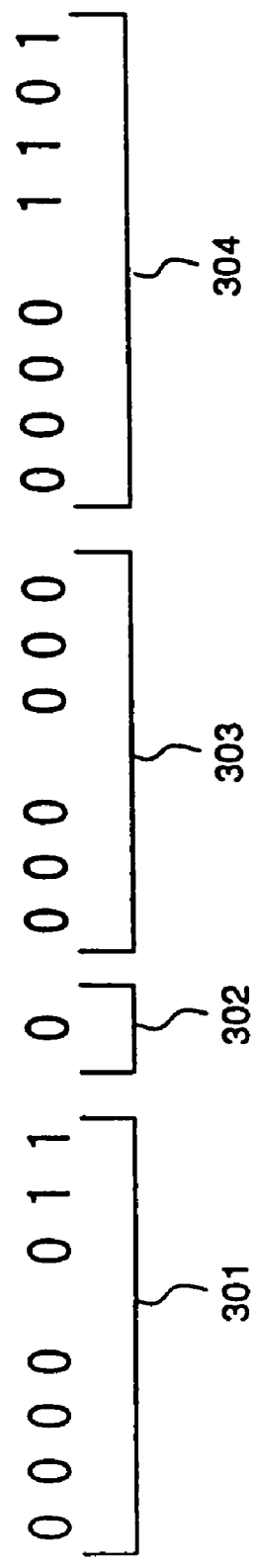
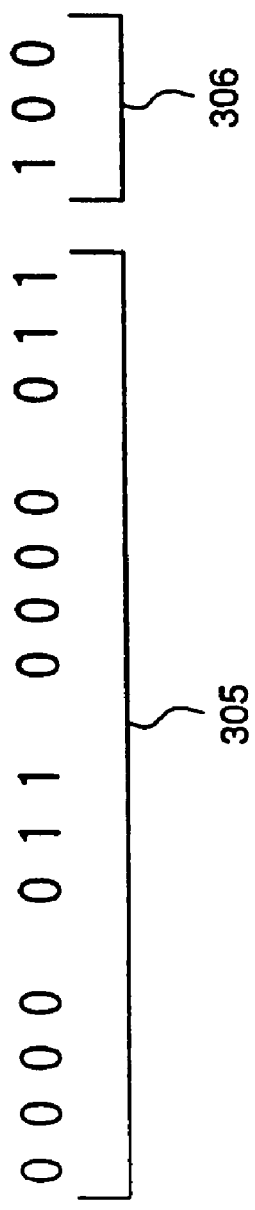
Fig.3 (a)
Fig.3 (b)

Fig.13 (a)

| QUANTIZATION SCALE | DIVISOR | NUMBER OF BITS OF REMAINDER |
|---|---|---|
| 1~7 | 2 | 1 |
| ≧8 | 1 | 0 |

Fig.13 (b)

| QUANTIZATION SCALE | DIVISOR | NUMBER OF BITS OF REMAINDER |
|---|---|---|
| 1~3 | 4 | 2 |
| 4~11 | 2 | 1 |
| ≧12 | 1 | 0 |

Fig.19

| INDEX | LAST | RUN | LEVEL | BITS | VLC CODE |
|---|---|---|---|---|---|
| 0 | 0 | 0 | 1 | 3 | 10s |
| 1 | 0 | 0 | 2 | 5 | 1111s |
| 2 | 0 | 0 | 3 | 7 | 0101 01s |
| 3 | 0 | 0 | 4 | 8 | 0010 111s |
| 4 | 0 | 0 | 5 | 9 | 0001 1111s |
| 5 | 0 | 0 | 6 | 10 | 0001 0010 1s |
| 6 | 0 | 0 | 7 | 10 | 0001 0010 0s |
| 7 | 0 | 0 | 8 | 11 | 0000 1000 01s |
| 8 | 0 | 0 | 9 | 11 | 0000 1000 00s |
| 9 | 0 | 0 | 10 | 12 | 0000 0000 111s |
| 10 | 0 | 0 | 11 | 12 | 0000 0000 110s |
| 11 | 0 | 0 | 12 | 12 | 0000 0100 000s |
| 12 | 0 | 1 | 1 | 4 | 110s |
| 13 | 0 | 1 | 2 | 7 | 0101 00s |
| 14 | 0 | 1 | 3 | 8 | 0001 1110s |
| 15 | 0 | 1 | 4 | 11 | 0000 0011 11s |
| 16 | 0 | 1 | 5 | 12 | 0000 0100 001s |
| 17 | 0 | 1 | 6 | 13 | 0000 0101 0000s |
| 18 | 0 | 2 | 1 | 5 | 1110s |
| 19 | 0 | 2 | 2 | 9 | 0001 1101s |
| 20 | 0 | 2 | 3 | 11 | 0000 0011 10s |
| 21 | 0 | 2 | 4 | 13 | 0000 0101 0001s |
| 22 | 0 | 3 | 1 | 6 | 0110 1s |
| 23 | 0 | 3 | 2 | 10 | 0001 0001 1s |
| 24 | 0 | 3 | 3 | 11 | 0000 0011 01s |
| 25 | 0 | 4 | 1 | 6 | 0110 0s |
| 26 | 0 | 4 | 2 | 10 | 0001 0001 0s |
| 27 | 0 | 4 | 3 | 13 | 0000 0101 0010s |
| 28 | 0 | 5 | 1 | 6 | 0101 1s |
| 29 | 0 | 5 | 2 | 11 | 0000 0011 00s |
| 30 | 0 | 5 | 3 | 13 | 0000 0101 0011s |

Fig.20

| 31 | 0 | 6 | 1 | 7 | 0100 11s |
|---|---|---|---|---|---|
| 32 | 0 | 6 | 2 | 11 | 0000 0010 11s |
| 33 | 0 | 6 | 3 | 13 | 0000 0101 0100s |
| 34 | 0 | 7 | 1 | 7 | 0100 10s |
| 35 | 0 | 7 | 2 | 11 | 0000 0010 10s |
| 36 | 0 | 8 | 1 | 7 | 0100 01s |
| 37 | 0 | 8 | 2 | 11 | 0000 0010 01s |
| 38 | 0 | 9 | 1 | 7 | 0100 00s |
| 39 | 0 | 9 | 2 | 11 | 0000 0010 00s |
| 40 | 0 | 10 | 1 | 8 | 0010 110s |
| 41 | 0 | 10 | 2 | 13 | 0000 0101 0101s |
| 42 | 0 | 11 | 1 | 8 | 0010 101s |
| 43 | 0 | 12 | 1 | 8 | 0010 100s |
| 44. | 0 | 13 | 1 | 9 | 0001 1100s |
| 45 | 0 | 14 | 1 | 9 | 0001 1011s |
| 46 | 0 | 15 | 1 | 10 | 0001 0000 1s |
| 47 | 0 | 16 | 1 | 10 | 0001 0000 0s |
| 48 | 0 | 17 | 1 | 10 | 0000 1111 1s |
| 49 | 0 | 18 | 1 | 10 | 000 1111 0s |
| 50 | 0 | 19 | 1 | 10 | 0000 1110 1s |
| 51 | 0 | 20 | 1 | 10 | 0000 1110 0s |
| 52 | 0 | 21 | 1 | 10 | 0000 1101 1s |
| 53 | 0 | 22 | 1 | 10 | 0000 1101 0s |
| 54 | 0 | 23 | 1 | 12 | 0000 0100 010s |
| 55 | 0 | 24 | 1 | 12 | 0000 0100 011s |
| 56 | 0 | 25 | 1 | 13 | 0000 0101 0110s |
| 57 | 0 | 26 | 1 | 13 | 0000 0101 0111s |

Fig.21

| INDEX | LAST | RUN | LEVEL | BITS | VLC CODE |
|---|---|---|---|---|---|
| 58 | 1 | 0 | 1 | 5 | 011s |
| 59 | 1 | 0 | 2 | 10 | 0000 1100 1s |
| 60 | 1 | 0 | 3 | 12 | 0000 0000 101s |
| 61 | 1 | 1 | 1 | 7 | 0011 11s |
| 62 | 1 | 1 | 2 | 12 | 0000 0000 100s |
| 63 | 1 | 2 | 1 | 7 | 0011 10s |
| 64 | 1 | 3 | 1 | 7 | 0011 01s |
| 65 | 1 | 4 | 1 | 7 | 0011 00s |
| 66 | 1 | 5 | 1 | 8 | 0010 011s |
| 67 | 1 | 6 | 1 | 8 | 0010 010s |
| 68 | 1 | 7 | 1 | 8 | 0010 001s |
| 69 | 1 | 8 | 1 | 8 | 0010 000s |
| 70 | 1 | 9 | 1 | 9 | 0001 1010s |
| 71 | 1 | 10 | 1 | 9 | 0001 1001s |
| 72 | 1 | 11 | 1 | 9 | 0001 1000s |
| 73 | 1 | 12 | 1 | 9 | 0001 0111s |
| 74 | 1 | 13 | 1 | 9 | 0001 0110s |
| 75 | 1 | 14 | 1 | 9 | 0001 0101s |
| 76 | 1 | 15 | 1 | 9 | 0001 0100s |
| 77 | 1 | 16 | 1 | 9 | 0001 0011s |
| 78 | 1 | 17 | 1 | 10 | 0000 1100 0s |
| 79 | 1 | 18 | 1 | 10 | 0000 1011 1s |
| 80 | 1 | 19 | 1 | 10 | 0000 1011 0s |
| 81 | 1 | 20 | 1 | 10 | 0000 1010 1s |
| 82 | 1 | 21 | 1 | 10 | 0000 1010 0s |
| 83 | 1 | 22 | 1 | 10 | 0000 1001 1s |
| 84 | 1 | 23 | 1 | 10 | 0000 1001 0s |
| 85 | 1 | 24 | 1 | 10 | 0000 1000 1s |
| 86 | 1 | 25 | 1 | 11 | 0000 0001 11s |
| 87 | 1 | 26 | 1 | 11 | 0000 0001 10s |
| 88 | 1 | 27 | 1 | 11 | 0000 0001 01s |

Fig.22

| 89 | 1 | 28 | 1 | 11 | 0000 0001 00s |
|---|---|---|---|---|---|
| 90 | 1 | 29 | 1 | 12 | 0000 0100 100s |
| 91 | 1 | 30 | 1 | 12 | 0000 0100 101s |
| 92 | 1 | 31 | 1 | 12 | 0000 0100 110s |
| 93 | 1 | 32 | 1 | 12 | 0000 0100 111s |
| 94 | 1 | 33 | 1 | 13 | 0000 0101 1000s |
| 95 | 1 | 34 | 1 | 13 | 0000 0101 1001s |
| 96 | 1 | 35 | 1 | 13 | 0000 0101 1010s |
| 97 | 1 | 36 | 1 | 13 | 0000 0101 1011s |
| 98 | 1 | 37 | 1 | 13 | 0000 0101 1100s |
| 99 | 1 | 38 | 1 | 13 | 0000 0101 1101s |
| 100 | 1 | 39 | 1 | 13 | 0000 0101 1110s |
| 101 | 1 | 40 | 1 | 13 | 0000 0101 1111s |
| 102 | ESC | | | 7 | 0000 011 |

Fig.23 (a)

| INDEX | RUN | CODE |
|---|---|---|
| 0 | 0 | 000 000 |
| 1 | 1 | 000 001 |
| 2 | 2 | 000 010 |
| ⋮ | ⋮ | ⋮ |
| 63 | 63 | 111 111 |

Fig.23 (b)

| INDEX | LAST | CODE |
|---|---|---|
| - | -128 | FORBIDDEN |
| 0 | -127 | 1000 0001 |
| ⋮ | ⋮ | ⋮ |
| 125 | -2 | 1111 1110 |
| 126 | -1 | 1111 1111 |
| - | 0 | FORBIDDEN |
| 127 | 1 | 0000 0001 |
| 128 | 2 | 0000 0010 |
| ⋮ | ⋮ | ⋮ |
| 253 | 127 | 0111 1111 |

US 7,116,829 B1

IMAGE CODING AND DECODING METHODS, IMAGE CODING AND DECODING APPARATUSES, AND RECORDING MEDIA FOR IMAGE CODING AND DECODING PROGRAMS

This is a Rule 1.53(b) continuation of application Ser. No. 09/906,833, filed Jul. 18, 2001, now U.S. Pat. No. 6,574,369, which is a Rule 1.53(b) continuation of application Ser. No. 09/091,985, filed Aug. 11, 1998, now U.S. Pat. No. 6,345,123.

TECHNICAL FIELD

The present invention relates to image coding and decoding methods, image coding and decoding apparatuses, and recording media for image coding and decoding programs, more specifically, to an image coding process in which a variable coding of high versatility is performed and an image decoding process performed to the result of this image coding.

BACKGROUND ART

Compression coding is essential for efficiently storing or transmitting a digital image. As a method of compressively coding a digital image, used is discrete cosine transformation (DCT) that is a dominant technology in typical standards like JPEG (Joint Photographic Experts Group) and MPEG (Moving Picture Experts Group); In addition, waveform coding methods such as subband coding, wavelet transformation, and fractal are also used as the coding methods as well. To remove redundant signals between images, intra-frame coding is basically preformed based on a spatial correlation within one still image; in addition to this, inter-image coding is also performed in which inter-image prediction using motion compensation is performed based on a temporal correlation between each set of adjacent still images, and a difference signal obtained is subjected to waveform coding. Use of the both methods makes it possible to obtain coded data with a high compression ratio.

In the conventional image coding process according to the MPEG standard or the like, after the DCT process or the like, quantization process is performed, followed by variable length coding process. More specifically, a process such as DCT, subband, or wavelet is performed to digital image data, and the transform coefficients obtained by the above process are quantized using a prescribed quantization scale to generate quantized transform coefficients to which variable length coding process is to be performed.

The quantized transform coefficients obtained by quantization process are arranged in a two-dimensional array, and each coefficient indicates zero or non-zero. In the variable length coding process, zigzag scanning is performed to the coefficients (zero and non-zero) arranged in the two-dimensional array in a prescribed scanning order to rearrange the coefficients in one dimension, and thereafter, events are generated from the one-dimensional array of coefficients. Each event consists of a Run that indicates a number of preceding zero coefficients and a Level that indicates the value of a non-zero coefficient. Then, coding is performed by referring to a variable length code table prepared in advance in which a unique variable length code is allocated to each event consisting of a Run and a Level. Moreover, in stead of this method, an alternative method may be used, such as a method of allocating another code which indicates if a coefficient is a last one, or a method of performing coding with reference to a table where variable length codes are allocated to events each consisting of a set of (Run, Level, Last) obtained by adding a Last indicating if a coefficient is a last one to a set of a Run and a Level.

FIG. 18 is a flowchart illustrating the procedure of a prior art coding process to an event consisting of (Last, Run, Level). Hereinafter a description is given of the conventional coding process with reference to the flow of FIG. 18.

Following the initiation of the process in step 1801, a j-th event is input as an input event which is an object to be processed. In step 1803, comparison is performed between this input event and a reference event included in a variable length code table.

FIGS. 19 through 22 show instances of the variable length code table used for the prior art variable length coding process. As illustrated, in the tables, events each consisting of (Last, Run, Level) correspond to codes. In the figures, "s" in a "VLC CODE" cell indicates zero when Level is positive, whereas it indicates 1 when Level is negative. Further, when Last is 0, it indicates that the coefficient concerned is not the last coefficient.

In step 1803 of FIG. 18, by referring to this variable length code table, comparison is performed between the input event and each reference event included in the table consisting of (Last, Run, Level); In step 1804, according to the above comparison process, it is decided whether there is a reference event of which (Last, Run, Level) is identical to that of the input event. When it is decided in step 1804 that there is such reference event, step 1805 is performed, whereas, when such a reference event is not found, step 1806 is performed. At this point, if step 1805 is performed, a variable length code corresponding to the reference event is output, followed by step 1807 which will be described later.

On the other hand, in the case where step 1806 is performed, that is, in the case where the (Last, Run, Level) identical to that of the event as an object to be processed cannot be found when the variable length code table is referred, fixed length coding is performed in step 1806. FIG. 23 are diagrams conceptually illustrating fixed length coding. As shown in the figures, the codes shown in FIG. 23(*a*) are allocated to RUNs and the codes shown in FIG. 23(*b*) allocated to Levels, respectively, and these codes are the results of the coding. In this fixed length coding process, a control code for indicating that a result of the coding is a fixed-length code is added in such a way that it is transmitted prior to the result of the coding, so as to distinguish the code obtained by fixed length coding from the code obtained by variable length coding. This control code is called "escape code (ECS)", and in this case, a code "0000011" shown in FIG. 22 is used as the control code. More specifically, when fixed length coding is performed, coded data is obtained comprising a 7-bit ESC code and the code thus allocated subsequent to the ESC code.

Following the performance of step 1805 or step 1806, in the subsequent step 1807, it is decided whether an input event processed is a last input event or not, and if it is decided that the event is the last one, the coding process is completed in step 1808. On the other hand, if it is decided that the event is not the last one, j is incremented by 1 in step 1809 and the operation returns to step 1802, whereby a next input event is processed in the same manner. Thus, the process is continued to the last non-zero coefficient.

As described above, in the prior art image coding process, events are generated for quantized transform coefficients and comparison is made between the event and a reference event included in a variable length code table; if the matching event is found, a variable length code derived from the table is used, whereas, if no matching event is found, a result of fixed length coding, to which a control code (ESC code) is added, is used.

Generally, a variable length code table is formed by investigating statistical distribution using numeral images and allocating shorter codes to the events occurring most frequently, whereby the overall compression ratio is improved. As described above, if coding is not performed using a variable length code table, fixed length coding is performed and the compression ratio is thus degraded; Therefore, it is desired to make a setting which hardly causes fixed length coding. In the prior art image coding, as shown in FIG. 18, if it is decided in step 1804 that there is no reference event concerned, fixed length coding is immediately performed in step 1806, which means that a rate of performing variable length coding with better coding efficiency is directly decided by a rate at which an event concerned is present in a variable length code table.

In image compression coding, however, the statistical distribution of coefficients varies according to the quantization scale, and it is understood that the distribution of coefficients having high compression ratio differs considerably from that having low compression ratio. Therefore, when an appropriate variable length code table is not used for coefficients as objects, the rate at which the event concerned is present in the variable length code table is decreased and the rate of performing fixed length coding is increased, resulting in reduced coding efficiency.

Generally, as the quantization scale is increased, the compression ratio of quantized transform coefficients is increased, but the event derived from such quantized transform coefficients tends to have a smaller value of Level. The variable length code table shown in FIGS. 19 to 22 includes many events having small Level values to which short codes are allocated, and is suitable for use in the case where quantized transform coefficients having relatively high compression ratio are used as processing objects. Therefore, if the quantization scale is small and the compression ratio of quantized transform coefficients is low, many of the events derived have large Level values. So, the rate at which an event concerned is not present in such variable length code table is increased and the events present in the table are often allocated relatively long codes, resulting in increased bit number of the result of the coding. In other words, employing a variable length code table formed for low compression ratio in coding at high compression ratio leads to decrease in coding efficiency.

As described above, when a variable length code table set properly is not used for the coefficients which are the processing objects of variable length coding, since variable length coding cannot be performed and fixed length coding is performed more frequently, and the amount of bits is increased even when variable length coding is performed, the amount of code is increased and improvement of compression ratio is prevented, which is a problem of the prior art image coding process.

DISCLOSURE OF THE INVENTION

The present invention is proposed in view of the above-described problems, and has an object to realize that in image coding, any object of coding in a wide range, which ranges from the one having high compression ratio to the one having low compression ratio, is coded with improved efficiency using a single variable length code table.

To solve the above-described problems, provided is an image coding method of the present invention in which transform coefficients are obtained for an image to be coded by a prescribed transformation method, quantization process is performed to the transform coefficients using a prescribed quantization scale to obtain quantized transform coefficients, and variable length coding process is performed to the quantized transform coefficients referring to a variable length code table comprising a plurality of reference events paired with variable length codes, and the method includes: a first variable length coding step of obtaining a first result of comparison by comparison process between the quantized transform coefficient and a reference event included in the variable length code table, and if the first result of comparison shows "matching", obtaining a first result of coding using a variable length code corresponding to the reference event; a second variable length coding step of, if the first result of comparison does not show "matching", obtaining a second result of comparison by comparison process between the quantized transform coefficient and a reference event included in the variable length code table subject to a transformation process using a prescribed function, and if the second result of comparison shows "matching", obtaining a second result of coding which is distinguishable from the first result of coding using a variable length code corresponding to the reference event; and a particular coding step of, if the second result of comparison does not show "matching", performing coding process to the quantized transform coefficient using a prescribed coding system to obtain a result of coding which is distinguishable from each of the first and second results of coding; therefore, a rate of performing variable length coding is raised, and a compression ratio of resultant coded data is increased, thereby improving efficiency of coding process using a variable length code table.

Another image coding method of the present invention in which transform coefficients are obtained for an image to be coded by a prescribed transformation method, quantization process is performed to the transform coefficients using a prescribed quantization scale to obtain quantized transform coefficients, and variable length coding process is performed to the quantized transform coefficients referring to a variable length code table comprising a plurality of reference events paired with variable length codes, includes a variable length coding step which comprises the steps of: performing division process to the quantized transform coefficient using a divisor decided based on the quantization scale, to obtain a quotient and a remainder; obtaining a result of comparison with quotient by comparison process with a reference event included in the variable length code table, using the quotient; and, if the result of comparison with quotient shows "matching", employing a variable length code corresponding to the reference event and adding an auxiliary code obtained by performing coding process to the remainder using a prescribed coding system, to obtain a result of coding; The transformation process using division increases a matching rate in comparison, thereby improving efficiency of coding process utilizing a variable length code table.

Still another image coding method of the present invention is an image coding method in which transform coefficients are obtained for an image to be coded by a prescribed transformation method, quantization process is performed to the transform coefficients using a prescribed quantization scale to obtain quantized transform coefficients, and variable length coding process is performed to the quantized transform coefficients referring to a variable length code table comprising a plurality of reference events paired with variable length codes, wherein, a variable length coding step is performed which comprises the steps of: performing transformation process with a prescribed function to a reference event included in the variable length code table, based on the quantization scale, to generate a transformed event; obtaining a result of transformation comparison by comparison process between the quantized transform coefficient and the transformed event; and, if the result of transformation comparison shows "matching", obtaining a result of coding using a variable length code corresponding to the reference event based on which the transformed reference event is generated; the transformation process applied to a reference event included in a variable length code table raises a matching rate in comparison, thereby improving efficiency of coding process utilizing a variable length code table.

According to the present invention which is described above, an effect is available that a wide range of images (ranging from the one having a high compression ratio to the one having a low compression ratio) can be coded with improved efficiency, using a single variable length code table.

Further, the image coding apparatus of the present invention can obtain a result of coding having high compression ratio by implementing the above-described image coding method.

Furthermore, in an image decoding method of the present invention, appropriate decoding process is performed to the result of coding obtained by the above image coding method.

Still furthermore, the image decoding apparatus of the present invention can perform appropriate decoding process to the result of coding obtained by the above image coding apparatus.

Moreover, a recording medium for image coding program of the present invention, when an image coding program implementing the above-described image coding method is recorded, implements an image coding apparatus capable of obtaining results of coding with high compression ratio utilizing a device resource, by running the program on a computer system.

In addition, a recording medium for image decoding program of the present invention, when an image decoding program implementing the above-described image decoding method is recorded, implements an image decoding apparatus capable of performing appropriate decoding process to results of coding with high compression ratio utilizing a device resource, by running the program on a computer system.

BRIEF DESCRIPTION OF THE DRAWINGS

FIGS. 3(a)–3(b) are explanatory diagrams illustrating examples of a code transformed by the variable length coding method according to the same embodiment.

FIGS. 13(a)–13(b) are diagrams illustrating relations between quantization scales and divisors used for transformation process in the variable length coding method according to the same embodiment.

FIGS. 19 through 22 are diagrams showing examples of variable length code table used for variable length coding.

FIGS. 23(a)–23(b) are diagrams for explaining fixed length coding process.

BEST MODES FOR CARRYING OUT THE INVENTION

Embodiment 1

An image coding method according to a first embodiment of the present invention is intended to increase chances of using a variable length code table by performing transformation process to events which are objects to be coded, thereby improving coding efficiency.

Figure 1:
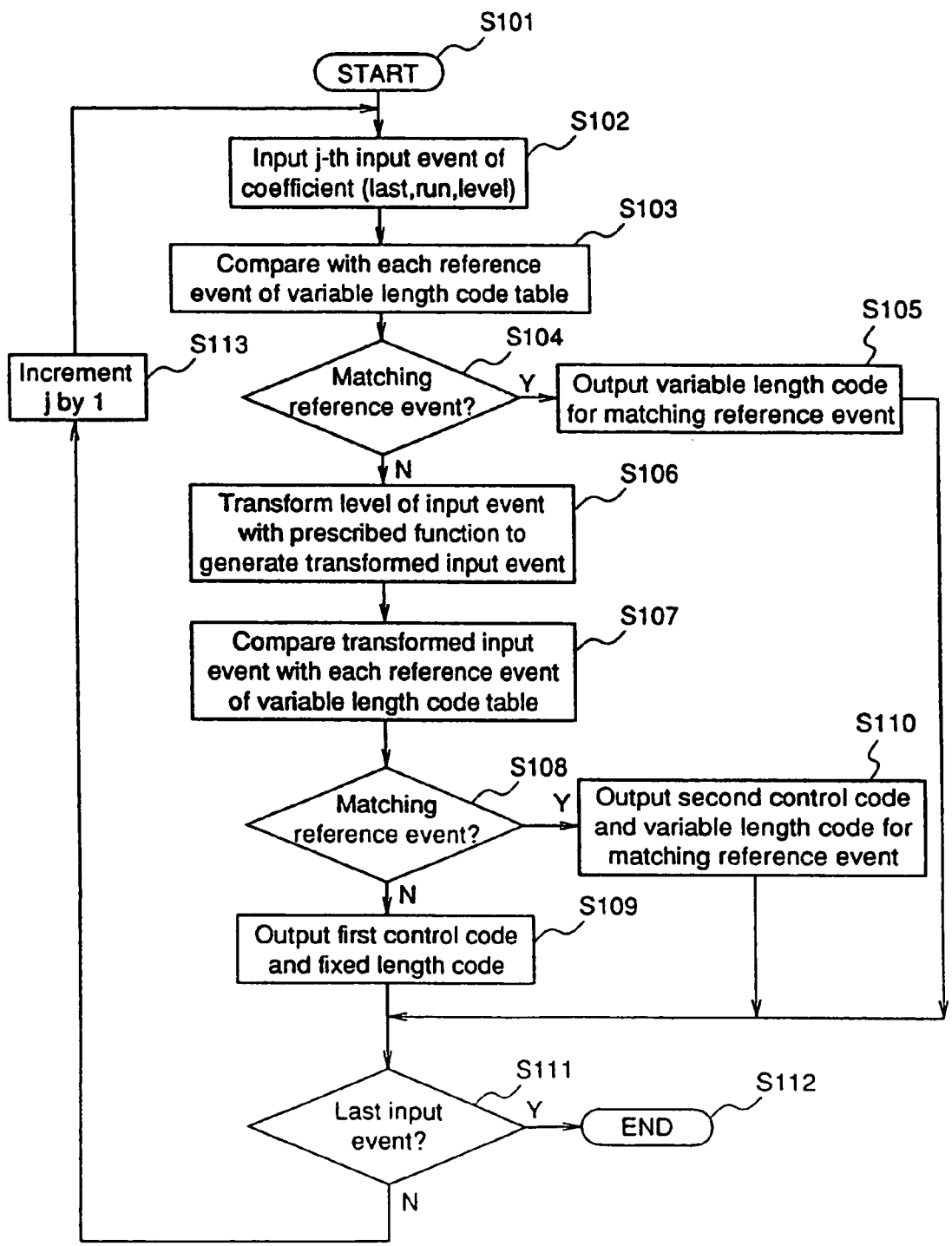
FIG. 1 is a flowchart illustrating the procedure of a variable length coding method according to a first embodiment of the present invention.

FIG. 1 is a flowchart showing the procedure of a variable length coding method according to the first embodiment of the present invention. Further, FIG. 2 is a block diagram illustrating the configuration of an image coding apparatus performing the variable length coding process according to the first embodiment, and FIG. 3 are diagrams showing examples of the result of the variable length coding.

Figure 2:
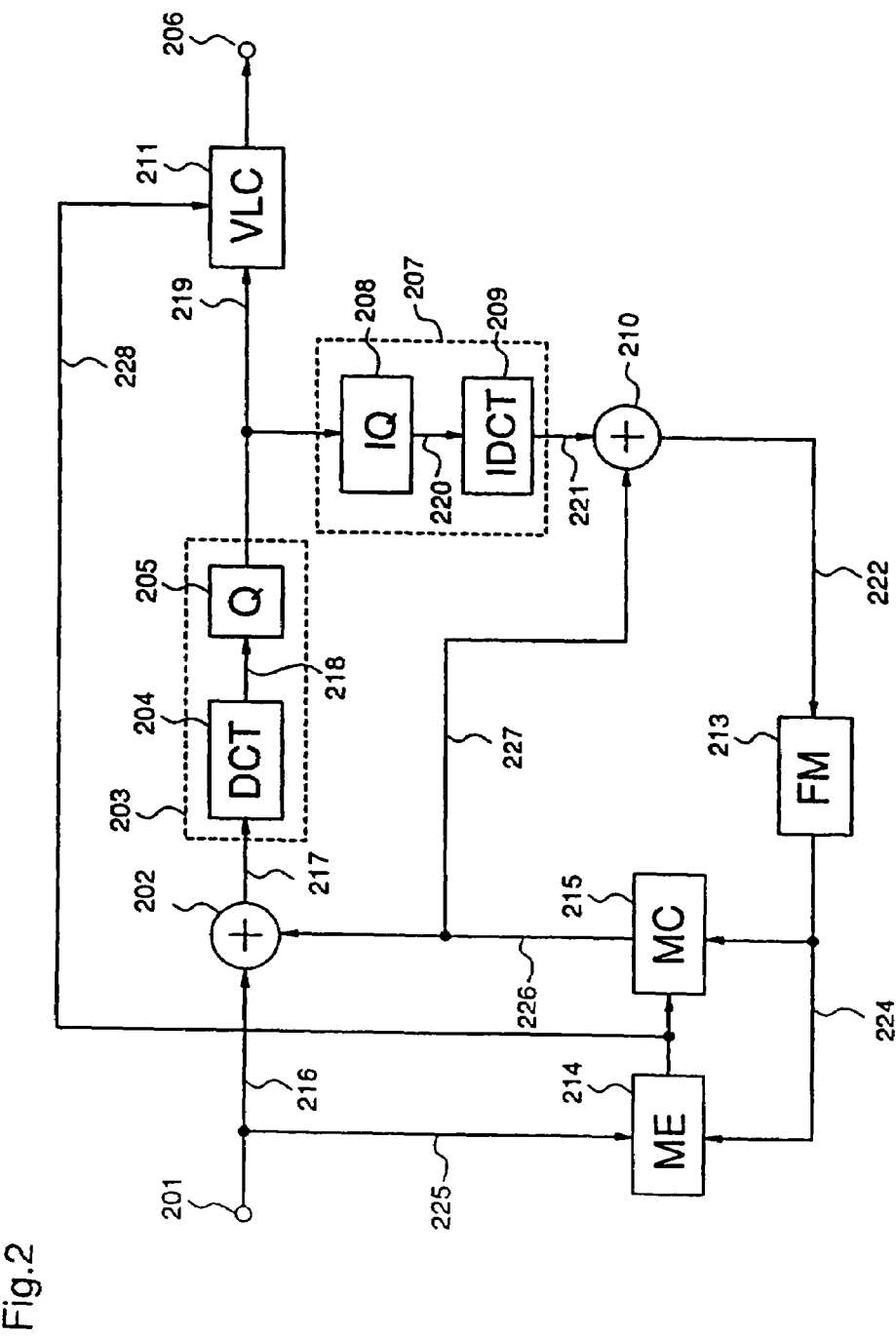
FIG. 2 is a block diagram illustrating the configuration of an image coding apparatus according to the same embodiment.

Initially, a description is given of the image coding apparatus according to the first embodiment, using FIG. 2. As shown in the figure, the image coding apparatus according to the first embodiment comprises: a first adder 202, a coder 203, a second adder 210, a variable length coder (VLC) 211, a frame memory (FM) 213, a motion extractor (ME) 214, and a motion compensator (MC) 215, and it receives from an input terminal 201 digital image data which is an object of coding process and outputs from an output terminal 206 the coded data which is the output of the image coding apparatus. The coder 203 contains a discrete cosine transformation unit (DCT) 204 and a quantizer (Q) 205, and the decoder 207 also contains an inverse quantizer (IQ) 208 and an inverse discrete cosine transformation unit (IDCT) 209.

Hereinafter a description is given of the operation of the image coding apparatus thus constructed. First of all, an image to be coded, which is digital image data, is input to the input terminal 201. The image to be coded is divided into a plurality of adjacent small regions. In the first embodiment, an image to be coded is divided into a plurality of adjacent 16×16 blocks and coding process is performed for each of the divided blocks.

An object block, which is a block as an object to be coded, is input to the first adder 202 through a line 216 as well as to the motion extractor 214 through a line 225. Further, the frame memory 213 stores a previous reconstructed image, which will be described later, and the motion extractor 214 receives the stored image through a line 224 and performs motion extraction process to the objet block to be coded using the image as a reference image, to obtain a motion vector. In the motion extraction process, motion displacement information which gives a prediction signal of minimum error to an object block to be coded is obtained by block matching or other method, and the motion displacement information is treated as a motion vector. The motion extractor 214 outputs the motion vector to the motion compensator 215. The motion vector is also output through a line 228 to the variable length coder 211 where it is transformed into a variable length code and added to a result of coding as a part of side information.

The motion compensator 215 also uses the image stored in the frame memory 213 as a reference image, generates a predicted block from this reference image and the motion vector and outputs it to the first adder 202 through a line 226 as well as to the second adder 210 through a line 227. The first adder 202 derives a difference between the input object block and the input predicted block to generate a difference block, and outputs it to the coder 203 through a line 217.

The difference block is compression-coded at the coder 203. In the first embodiment, the difference block is input to the discrete cosine transformation unit 204 and transformed into coefficients in a frequency domain; the coefficients in the frequency domain are input through a line 218 to the quantizer 205 which performs quantization process using a prescribed quantization scale. When the first adder 202 does not derive a difference, that is, intra-image coding is performed, the object block is input to the coder 203 where it is processed in the same manner in which the difference block is processed.

Quantized transform coefficients and the quantization scale used for the quantization process are output from the quantizer 205 through a line 219 to the variable length coder 203 where coding process is performed and the result of coding is output together with the side information including the motion vector and the quantization scale to an output terminal 206. The quantized transform coefficients are, at the same time, output to the decoder 207 where expansion process is performed. In the first embodiment, inverse quantization is performed using the above quantization scale in the inverse quantizer 208 and the result is input through a line 221 to the inverse discrete cosine transformation unit 209 where spatial domain data is derived by an inverse of discrete cosine transformation process. The difference block obtained by expansion in the decoder 207 is output through a line 221 to the second adder 210 where a predicted block transmitted through a line 227 is added to generate a reconstructed block. This reconstructed block is output through a line 222 to the frame memory 213 and stored therein to be used as a reference image in the subsequent coding process.

In the image coding apparatus of the first embodiment, the variable length coder 211 receives, as inputs, quantized transform coefficients and side information which includes quantization scale, motion vector, and others, and transforms them into variable length codes or fixed length codes. Hereinafter a description is given of the operation for the process to quantized transform coefficients by the variable length coder 211, with reference to the flow of FIG. 1.

As described in the explanation for the prior art, transform coefficients are obtained in a form of two-dimensional array which is composed of zero coefficients and non-zero coefficients; for this two-dimensional array, rearrangement is performed in a prescribed order (in zigzags) to obtain a one-dimensional array, and events are made each consisting of a number of proceeding zero coefficients (Run) and a value of non-zero coefficient (Level). Further, Last is added which is the information indicating whether a transform coefficient represented by Level is the last coefficient in a block or not. An event thus formed which consists of (Last, Run, Level) is treated as an input event which is an object to be processed by the variable length coder 211.

Following the initiation of the process in step 101, a j-th input event is obtained in step 102. In step 103, comparison is performed between the input event and a reference event present in a variable length code table in the variable length coder 211. As for the variable length code table, the tables of FIGS. 19 to 22 used in the prior art are used, and comparison is performed with each reference event included in the table and consisting of (Last, Run, Level).

In step 104, it is decided whether a reference event having a matching (Last, Run, Level) is found in the above comparison process or not. When it is decided in step 104 that the reference event is found, step 105 is performed, and when it is not found, step 106 is performed. At this point, if step 105 is performed, a variable length code corresponding to the reference event is output, followed by step 111.

On the other hand, if step 106 is performed, transformation process using a prescribed function is performed to the Level included in the input event to generate a transformed input event. In step 107 which follows, comparison is performed between a transformed input event and a reference event as in the case of step 103. In step 108 which follows, it is decided whether a matching reference event is found or not, and when a reference event is found, step 110 is performed, and when it is not found, step 109 is performed. At this point, if step 110 is performed, a result of coding is output which is the variable length code corresponding to the reference event to which a second control code uniquely set in advance is added, followed by step 111.

On the other hand, if step 109 is performed, the coding process as shown in FIG. 23 is performed to the input event to generate a fixed length code. Then, a result of coding is output which is the fixed length code to which a first control code distinguishable from the second control code is added.

If either step 110 or step 109 is performed, in a step 111 which follows, it is decided whether an input event processed is a last input event or not, and if the event is the last one, the coding process is completed in step 112. On the other hand, when the event is not the last one, j is incremented by 1 in step 113, and the operation returns to step 102, whereby a next input event is processed in the same manner. Thus, the process is continued to the last non-zero coefficient.

In the first embodiment, a process of deduction of an Offset value having a prescribed value is used as a prescribed function for obtaining a transformed input event from the input event. More specifically, a transformed input event is derived by deducing an Offset from the value of Level of the input event. It is preferable to deduct an Offset from the absolute value of Level and then append a sign code of Level (positive or negative). The offset may be a single value, or it may have a variable value corresponding to values of Last and Run. In the first embodiment, this can be obtained from the table of FIGS. 19 to 22 in such a way that the maximum Level value for each set of (Last, Run) is used as an Offset value: for example, Offset=12 for (Last, Run)=(0, 0), Offset=6 for (Last, Run)=(0, 1), and Offset=4 for (Last, Run)=(0, 2).

The variable length code table shown in FIGS. 19 to 22 is suitable for transform coefficients having relatively high compression ratio, and many of the Levels included in the events within the table have small values. Therefore, for an input event whose matching event is not present in the table, the deduction process is performed to the Level value thereof to obtain a transformed input event having a small Level value, thereby increasing the rate of performing variable length coding as well as the rate of using short codes allocated to the events having small Level values in the table.

Further, as a first control code, "0000011" is used which is identical to the ESC code shown in FIG. 23 used in the prior art; as a second control code, the ESC code repeated twice is used.

FIG. 3 are diagrams illustrating examples of the result of the coding. Here the coding process according to the first embodiment is compared with the prior art coding process, using FIG. 3. Now it is considered that an event having (Last, Run, Level)=(0, 0, 13) is an object to be coded. The variable length code table shown in FIGS. 19 to 22 does not have this set, (0, 0, 13). Therefore, if the prior art coding process shown in FIG. 23 is performed as described above, the fixed length coding process shown in FIG. 23 is performed as described above, and ESC code is added to this to be output. FIG. 3(*a*) shows the result of this process, and 6 bits 303 and 8 bits 304 both representing Levels are output subsequent to 7 bits 301 as ESC code and 1 bit 302 representing Last. Therefore, Levels are represented by 303 showing zero-run and the fixed length code 304. Thus, 22 bits are required in total.

Figure 18:
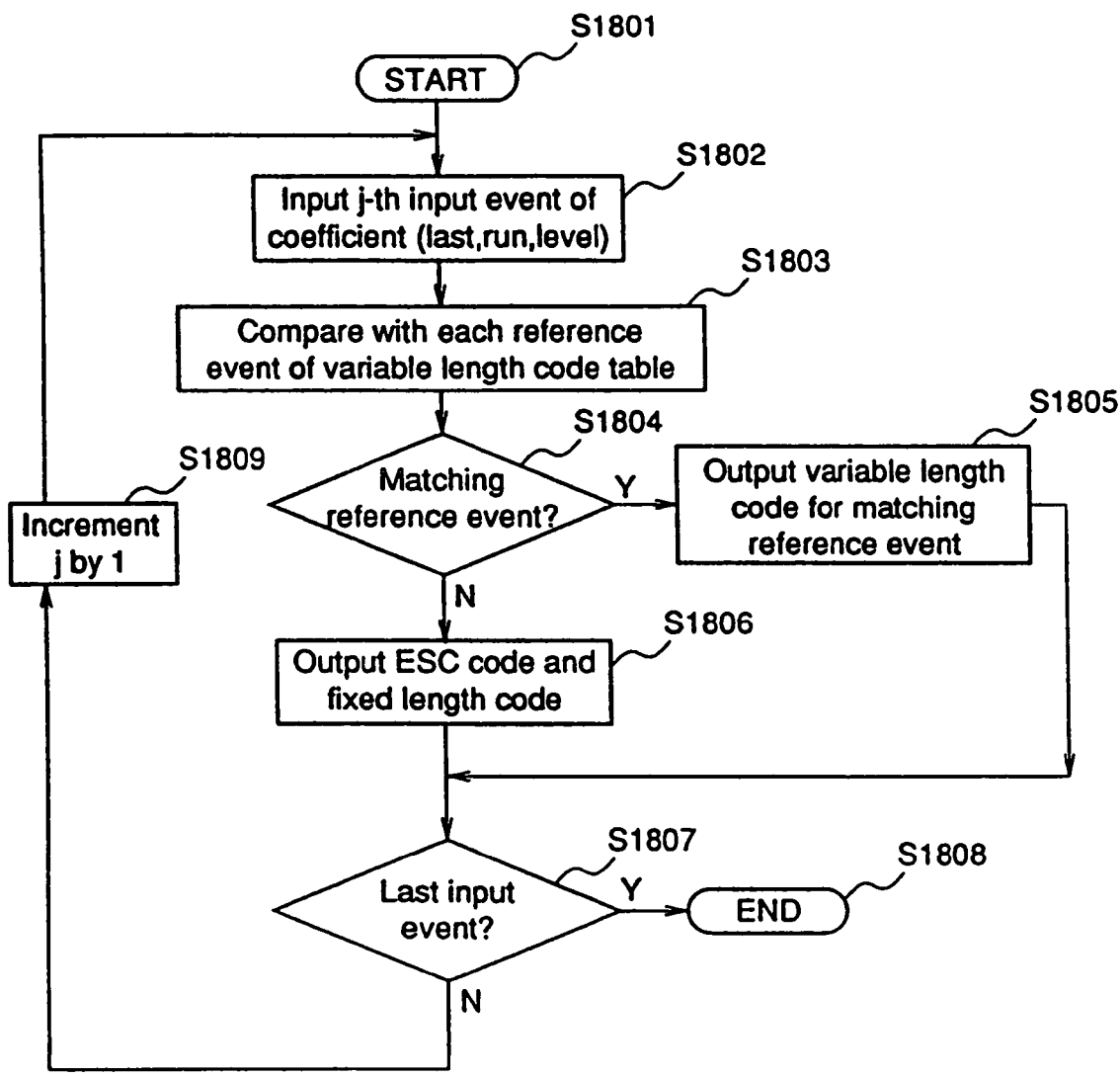
FIG. 18 is a flowchart illustrating the procedure of a prior art variable length coding method.

On the other hand, in the result of the process according to the first embodiment, when the reference event concerned is not present in the variable length code table in steps 103 through 104 of the flow of FIG. 1, fixed length coding is not performed immediately unlike the case of the prior art, and transformation process and comparison are performed again as shown in steps 106 through 108. In the transformation process, transformation is performed by deducting Offset (=12) from the Level value 13 to obtain a Level value of 1, thereby obtaining a transformed input event, (0, 0, 1). As shown in FIG. 18, since the event (0, 0, 1) is provided in the variable length code table, step 110 following step 108 is performed. Therefore, as shown in FIG. 3(*b*), the result of the coding is derived comprising a second control code 305 and a variable length code 306 corresponding to (0, 0, 1). Therefore, in this case, 17 bits are required in total, which means that the amount of code is reduced in comparison with the prior art case requiring 22 bits.

In the flow of FIG. 1, when a reference event concerned is not present in the variable length code table in the comparison process using the transformed input event, the process in step 109 is identical to that in the prior art. Therefore, in the first embodiment, at worst case, the coding identical to the prior art one can be performed. When the length of code to which the second control code is added is longer than that of the code to which the first control code is added, less number of bits can be obtained by coding with a first control code and a fixed length code.

Hereinafter a description is given of a decoding process to the coded data obtained by the image coding process according to the first embodiment.

Figure 4:
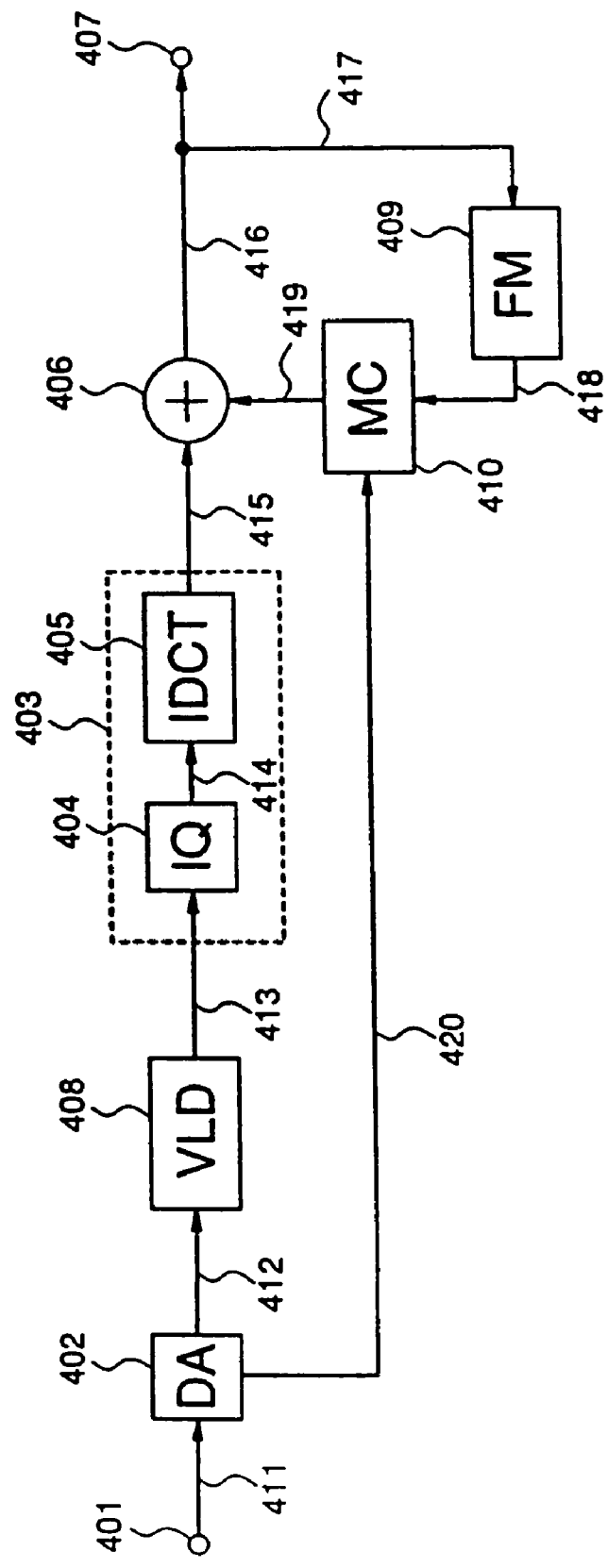
FIG. 4 is a block diagram illustrating the configuration of an image decoding apparatus according to the same embodiment.

FIG. 4 is a block diagram illustrating the configuration of an image decoding apparatus according to the first embodiment. As shown in FIG. 4, the image decoding apparatus according to the first embodiment comprises: a data analyzer (DA) 402, an adder 406, a variable length decoder (VLD) 408, a decoder 403, a frame memory (FM) 409, and a motion compensator (MC) 410, and it receives coded data which is an object of decoding process from an input terminal 401 and outputs decoded data which is the apparatus output of the image decoding apparatus from an output terminal 407. Further, the decoder 403 contains an inverse quantizer (IQ) 404 and an inverse discrete cosine transformation unit (IDCT) 405.

As for the image decoding apparatus of the first embodiment which is constructed above, a description is given of the operation for performing the decoding process to coded data which has been compression-coded by the image coding apparatus shown in FIG. 2.

Coded data as an object to be processed is input to the input terminal 401, and then analyzed by the data analyzer 402 to derive a variable length code according to quantized transform coefficients, and the codes of the side information including quantization scale and motion vector. Among them, the quantization scale and the variable length code of the quantized transform coefficients are transmitted to the variable length decoder 408 through a line 412, and the motion vector to the motion compensator 410 through a line 418. In the variable length decoder 408, the variable length code of the quantized transform coefficients is decoded into transform coefficients by referring to the variable length code table, and then the coefficients are rearranged to obtain compressed difference blocks and the blocks are output to the decoder 403.

In the decoder 403, the compressed difference block is expanded to generate a difference block. In the decoder 403 of the first embodiment, inverse quantization is performed using a quantization scale in the inverse quantizer 404, and the inverse discrete cosine transformation unit 405 performs transformation to the result so that a frequency-domain signal is transformed to a spatial domain signal. This signal is output as a difference block to an adder 406.

On the other hand, in the motion compensator 410 receiving the motion vector as an input, an address is generated based on the motion vector, for use to access a frame memory 409, and with respect to the image stored in the frame memory 409, a predicted block is generated. The predicted block generated is output to the adder 406 where addition process is performed between it and the difference block obtained by expansion to generate a reconstructed block. The image thus reconstructed is output from the output terminal 407 as the output of the image decoding apparatus, as well as to the frame memory 409 to be stored therein.

Figure 5:
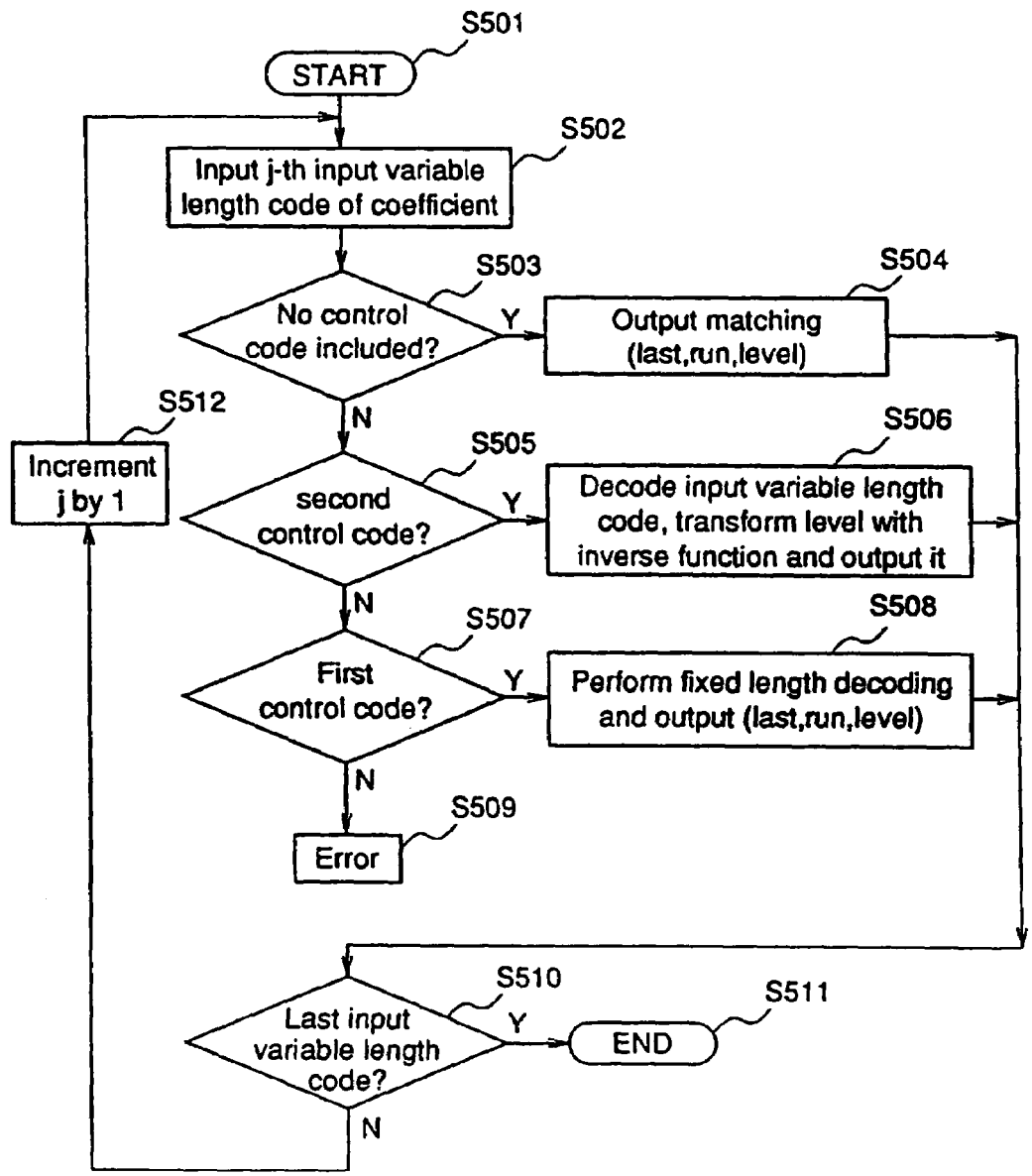
FIG. 5 is a flowchart illustrating the procedure of a variable length decoding method according to the same embodiment.

FIG. 5 is a flowchart showing the procedure of the variable length decoding method by the variable length decoder 408. Hereinafter a description is given of the operation of the coefficient variable length decoder 408 in the decoding process, with reference to the flow of FIG. 5.

In the decoder 503, the compressed difference block is expanded to generate a difference block. In the decoder 403 of the first embodiment, inverse quantization is performed using a quantization scale in the inverse quantizer 404, and the inverse discrete cosine transformation unit 405 performs transformation to the result so that a frequency-domain signal is transformed to a spatial domain signal. This signal is output as a difference block to an adder 406.

On the other hand, in the motion compensator 510 receiving the motion vector as an input, an address is generated based on the motion vector, for use to access a frame memory 409, and with respect to the image stored in the frame memory 409, a predicted block is generated. The predicted block generated is output to the adder 406 where addition process is performed between it and the difference block obtained by expansion to generate a reconstructed block. The image thus reconstructed is output from the output terminal 407 as the output of the image decoding apparatus, as well as to the frame memory 409 to be stored therein.

FIG. 5 is a flowchart showing the procedure of the variable length decoding method by the variable length decoder 508. Hereinafter a description is given of the operation of the coefficient variable length decoder 508 in the decoding process, with reference to the flow of FIG. 5.

Initially, following the initiation of the process in step 501, a variable length code obtained based on quantized transform coefficients, which is a j-th object to be processed, is input as an input variable length code. In step 503, it is decided whether the input variable length code includes a control code or not, and if it does not include a control code, step 504 is performed; if it includes the code, step 505 is performed. In the case where step 504 is performed, that is, in the case where no control code is included, a set of (Last, Run, Level) corresponding to the input variable length code is output by referring to the variable length code table, followed by step 510 which will be described later.

On the other hand, in the case where step 505 is performed, that is, in the case where a control code is included, it is decided whether the control code is a second control code or not; if it is the second control code, step 506 is performed, and if it is not that code, step 507 is performed. In the case where step 506 is executed, that is, in the case where the control code is a second control code, a set of (Last, Run, Level) corresponding to the input variable length code is obtained by using the variable length code table, and the Level value thereof is transformed with a predetermined function and the result is output, followed by step 510 which will be described later. In the first embodiment, a process of adding a predetermined Offset is performed, the value of this Offset varies according to a set of (Last, Run) as described above.

Here taken into account is the decoding process to the code shown in FIG. 3(b) If it is decided in step 505 that it is a second control code, step 506 is performed. Therefore, a set of (Last, Run, Level) corresponding to a part of the code, "100", which is shown as 306 in FIG. 3(b), can be obtained by referring to the variable length code table, and Offset=12 is added to this Level to regenerate the original set, (Last, Run, Level)=(0, 0, 13).

On the other hand, if step 507 is executed, it is also decided whether the control code is a first control code or not. If it is the first control code, step 508 is performed, but if it not the first control code, it is understood that the control code other than first and second control codes has been added. Therefore, in step 509, the decoding process is stopped or an error processing such as letting the user know that the decoding process is stopped. On the other hand, in the case where step 508 is performed, that is, in the case where it is a first control code, it is decoded as a fixed length code to regenerate coefficients.

If any of the steps 504, 506, and 508 is performed, in step 510 which follows, it is decided whether the processed input variable length code is the last one or not, and if it is the last one, the coding process is completed in step 511. On the other hand, if it is not the last one, the operation is returned to step 502 after j is incremented by 1, whereby a next input variable length code is processed in the same manner. Thus, the process is continued to the last variable length code.

As described above, according to the first coding method of the first embodiment, as shown in FIG. 1, if the reference event concerned is not included in the variable length code table in the comparison process in steps 103 through 104, the transformation process to the input event is performed in step 106, and in steps 107 through 108, comparison process is performed with the resultant transformed input event. Therefore, the rate of performing fixed length coding in step 109 can be reduced, and the possibility that short codes are allocated in variable length coding is increased by using the transformed input event, resulting in improved compression ratio of the result of coding as a whole.

Further, since the image coding apparatus of the first embodiment comprises the variable length coder 211 performing the above-described coding method, a result of coding with a high compression ratio can be obtained by using a single variable length code table whether the compression ratio of the compression coding in the coder 203 is high or low.

Furthermore, the image decoding method and image decoding apparatus according to the first embodiment are able to perform appropriate decoding process according to the result of coding obtained in the above-described manner to obtain reconstructed image.

Although it is described that, in the coding process depicted in the first embodiment, discrete cosine transformation is performed for compression coding, waveform coding such as wavelet coding may be applied instead of it and enables performing the same coding process.

Further, although in the coding process described in the first embodiment, a Level value of an input event is transformed in the transformation process for the input event, a Run value of the input event may be transformed instead. In this case, the maximum Run value corresponding to the set of (Last, Level) of each reference event in the variable length code table of FIGS. 19 to 22 is used as an Offset value, and (Offset+1) is deducted from the Run value of an input event to obtain a transformed input event. The transformation process may also be performed by other method such as multiplying a Level value or a Run value, performing a process using a quadratic function, or changing a dynamic range. It is also possible to transform a Level or a Run in a variable length code table with a prescribed function and then perform compression process, in place of performing a prescribed function to a Level or a Run of an input event.

As described above, when a Run value is transformed in coding process instead of a Level value, (Offset+1) is added to the Run value subjected to variable length decoding to generate an original Run value. In this case, the Offset value is the maximum Run value corresponding to a set of (Last, Level), as explained above.

Although in the first embodiment a description is given of the procedures of the coding and decoding processes with reference to the flowcharts of FIGS. 1 and 5, the coding and decoding processes are not limited to these procedures, and the procedures enabling the same processes can also improve coding efficiency and implement a suitable decoding process to the result of the coding.

Embodiment 2

In an image coding method according to a second embodiment of the present invention, transformation process is performed to an event as an object to be coded, as in the first embodiment, and the number of bits can be reduced by using mode code.

Figure 6:
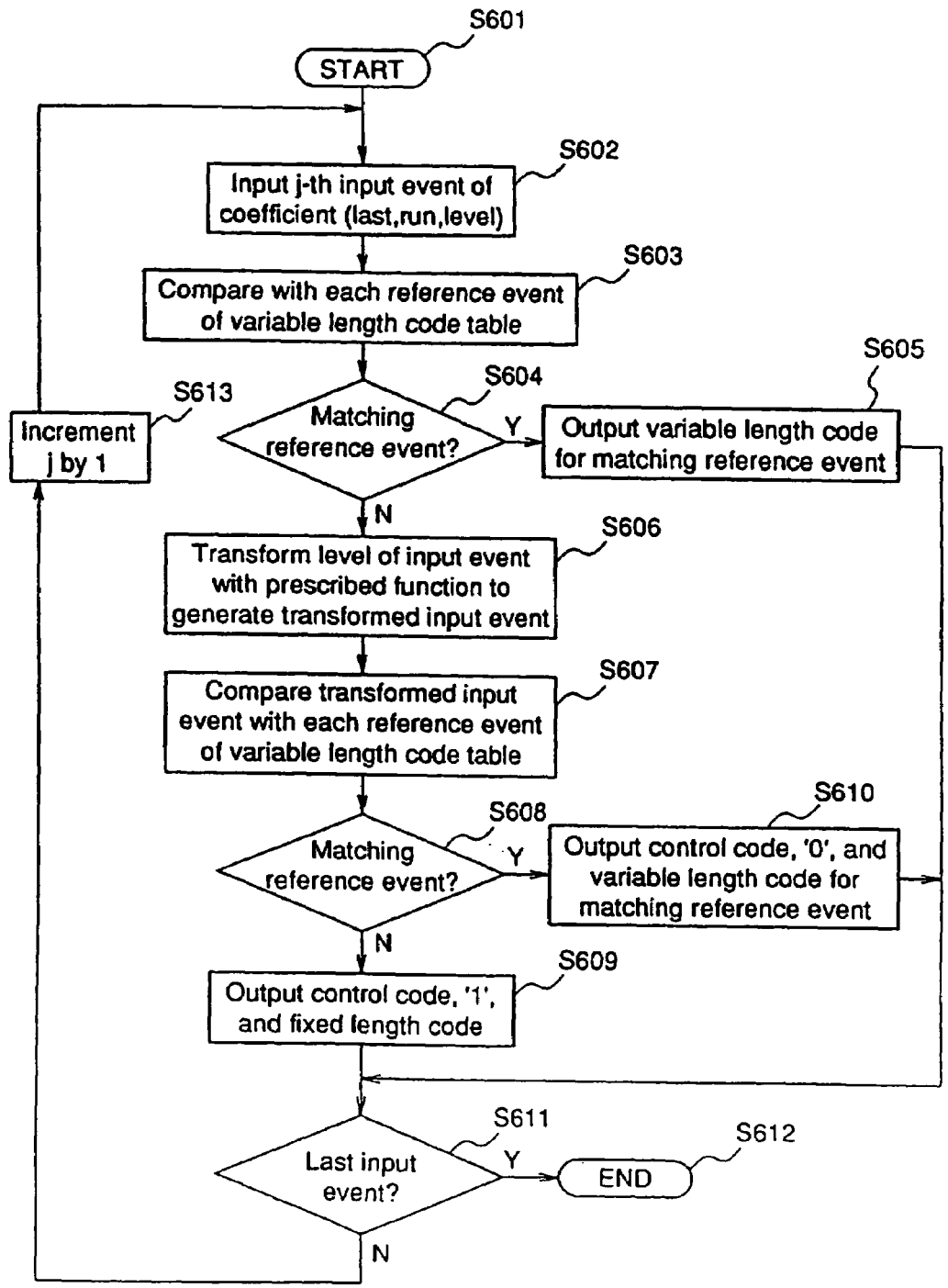
FIG. 6 is a flowchart illustrating the procedure of a variable length coding method according to a second embodiment of the present invention.

FIG. 6 is a flowchart showing the procedure of a variable length coding method according to the second embodiment. The image coding apparatus of the second embodiment also has the same configuration as that of the first embodiment, and thus FIG. 2 will be used for the description.

The image coding process according to the second embodiment differs from that of the first embodiment only in the process by the variable length coder 211 shown in FIG. 2, and thus a description is given of the operation by the variable length coder 211 in the coding process below with reference to FIG. 6.

Steps 601 through 608 are performed in the same manner as steps 101 through 108 in the first embodiment, and in step 108, decision is made based on a comparison between a transformed input event and a reference event of a variable length code table. If it is decided that there is a matching reference event, step 610 is performed; if such event is not found, step 609 is performed.

If step 610 is performed, a result of coding is output which is a variable length code corresponding to the reference event to which a control code set uniquely in advance and a second mode code are added, followed by step 611. Here, "0000011", which is identical to the ESC code shown in FIG. 22, is used as a control code, and "0" is used as the second mode code.

On the other hand, if step 609 is performed, the coding process shown in FIG. 23 is performed to an input event to generate a fixed length code. Then, a result of coding is output which is the fixed length code to which a control code and a first mode code are added. "1" is used as a first mode code.

If either step 610 or step 609 is performed, in a subsequent step 611, it is decided whether an input event processed is a last input event or not, and if the event is the last one, the coding process is completed in step 612. On the other hand, if the event is not the final one, the operation returns to step 602 after j is incremented by 1 in step 613, whereby a next input event is processed similarly. Thus, the process is continued to the last non-zero coefficient.

In the second embodiment, transformation is performed using an Offset corresponding to a Level of an input event to generate a transformed input event. As in the first embodiment, the Offset may take a fixed value or a variable value corresponding to a set of a Last and a Run. In this embodiment, used as an Offset is the maximum Level value corresponding to each set of (Last, Run) obtainable from the variable length code table shown in FIGS. 19 through 22, in such a way that Offset=12 for (Last, Run)=(0, 0), Offset=6 for (Last, Run)=(0, 1), and Offset=4 for (Last, Run)=(0, 2).

Hereinafter a description is given of a decoding process to the coded data obtained in the image coding process illustrated in the second embodiment. The configuration of the image decoding apparatus according to the second embodiment is identical to that of the first embodiment, and thus FIG. 4 will be used for the description.

Figure 7:
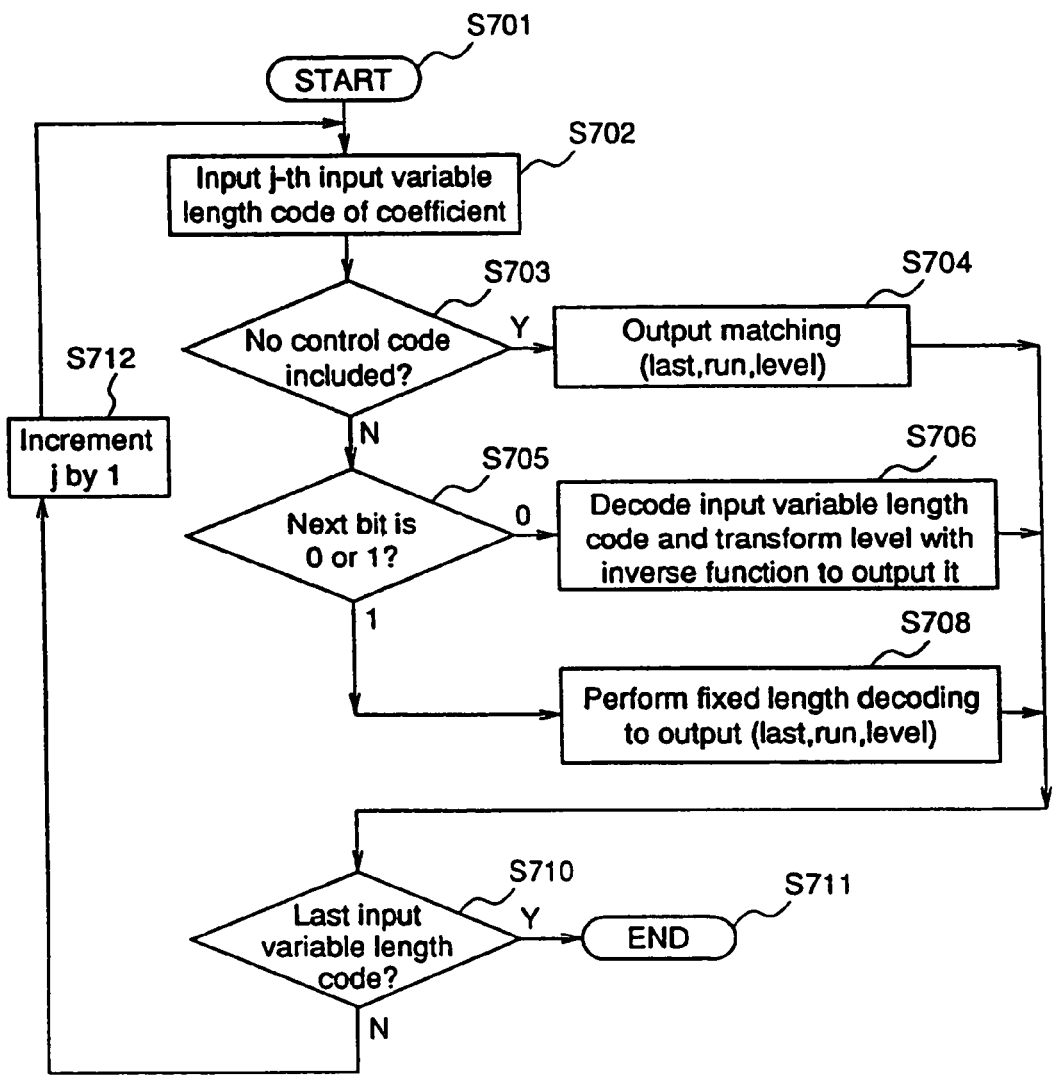
FIG. 7 is a flowchart illustrating the procedure of a variable length decoding method according to the same embodiment.

FIG. 7 is a flowchart showing the procedure of a variable length decoding method according to the second embodiment. The image decoding process according to the second embodiment differs from that of the first embodiment only in the process of the variable length decoder 408 shown in FIG. 4, and thus the operation by the variable length decoder 408 in the decoding process is described below with reference to FIG. 7.

Steps 701 though 704 are performed in the same manner as steps 501 through 504 according to the first embodiment (see FIG. 5), and then decision process is performed in step 705. If it is decided in step 703 that a control code is found, a decision process is performed to know whether a next one bit subsequent to the control code is "0" or "1". Then, if the bit is "0", step 706 is performed, and if the bit is "1", step 708 is performed.

If step 706 is performed, a set of (Last, Run, Level) corresponding to an input variable length code is obtained using a variable length code table, and transformation process is performed using a prescribed function corresponding to the Level value, and then the result of the decoding is output. In the transformation process of the second embodiment, a prescribed Offset is added to an obtained Level value. The Offset value takes a variable value corresponding to a set of (Last, Run), as described above.

On the other hand, if step 708 is performed, an input variable length code is decoded as a fixed length code to regenerate coefficients. If any of steps 704, 706, and 708 is performed, in a subsequent step 710, it is decided whether an input variable length code processed is the last input variable length code or not, and if the code is the last one, the coding process is completed in step 711. On the other hand, if it is not the last one, the operation is returned to step 702 after j is incremented by 1 in step 712, whereby a next input variable length code is processed in the same manner. Thus, the process is continued to the last variable length code.

As described above, in the image coding method according to the second embodiment, if a matching reference event is not present in a variable length code table in the comparison process in steps 603 through 604, transformation process is performed to an input event in step 606, and in steps 607 through 608, comparison process is performed using a transformed input event obtained, as shown in FIG. 6; therefore, a rate of performing fixed length coding in step 609 is reduced, and a possibility that short codes are allocated in variable length coding is increased due to use of a transformed input event, resulting in improved total compression ratio of a result of coding. Moreover, since a one-bit mode code is used in step 609 or step 610 to make a distinction between fixed length coding and a Level subjected to Offset process, a merit is available that a total number of bits of the result of coding can be reduced in comparison with the case of the first embodiment where first and second control codes are used.

Further, since the image coding apparatus according to the second embodiment comprises the variable length coder 211 performing the above-described coding method, a result of coding with an improved compression ratio can be obtained using a single variable length code table whether the compression ratio of the compression coding at the coder 203 is high or low.

Furthermore, the image decoding method and image decoding apparatus according to the second embodiment enable performing appropriate decoding process corresponding to the result of coding derived in the above-described manner to obtain reconstructed image.

Although in the second embodiment only one mode code is used, two or more mode codes may be used to distinguish plural modes. For example, a mode in which a value of a run of zero is changed may be added as a third mode.

Although in the second embodiment a Level of an input event is transformed to obtain a transformed input event as in the first embodiment, it is possible to transform a Run thereof. Further, although transformation process is performed using an Offset here, other method may be used such as multiplying a Level, subjecting to a quadratic function, and changing a dynamic range.

Embodiment 3

In an image coding method according to a third embodiment of the present invention, transformation process is performed to an event which is an object to be coded, as in the first and second embodiments, and coding efficiency can be improved by performing transformation process repetitively.

Figure 8:
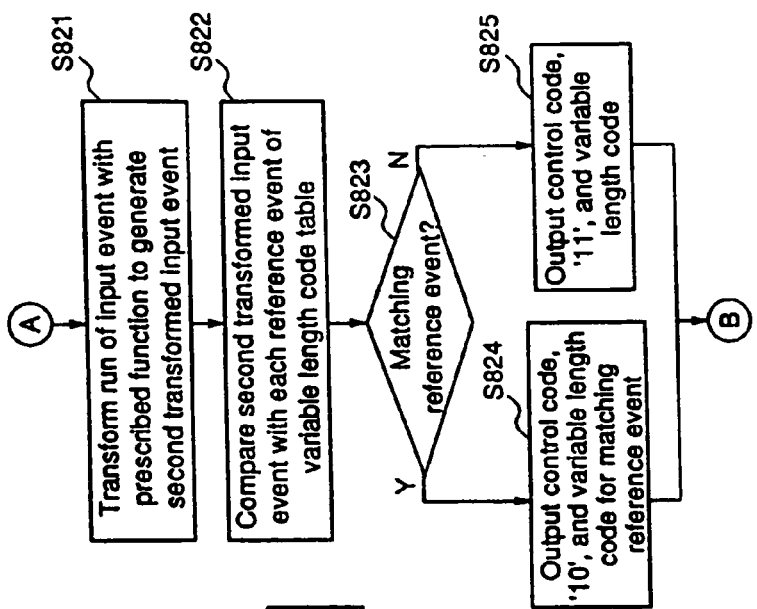
FIGS. 8(a)–8(b) are flowcharts illustrating the procedure of a variable length coding method according to a third embodiment of the present invention.
Figure 8:
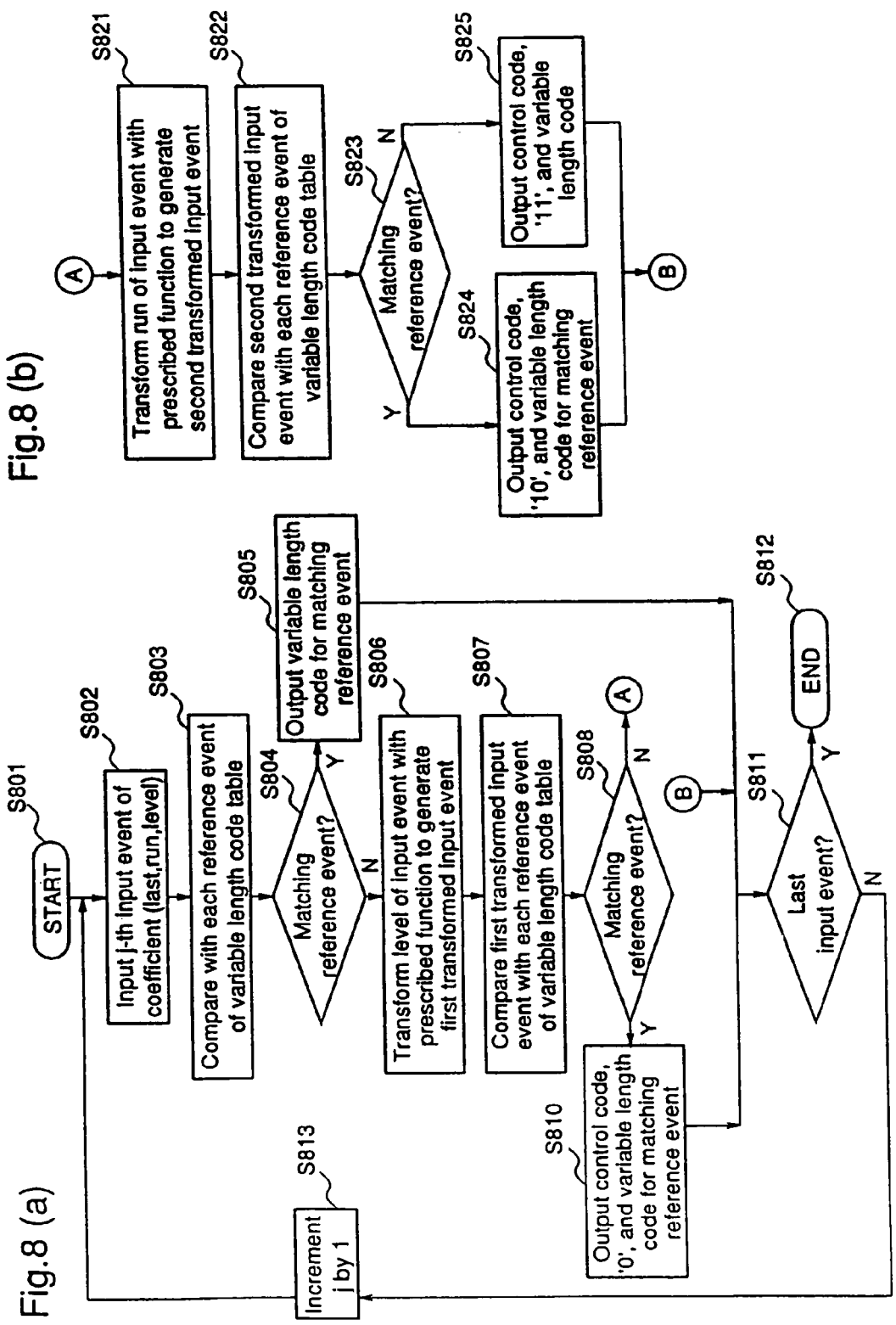

FIG. 8 are flowcharts showing the procedure of a variable length coding method according to the third embodiment. An image coding apparatus of the third embodiment has the same configuration as that of the first embodiment, too, and thus FIG. 2 will be used for the description.

The image coding process according to the third embodiment differs from that of the first embodiment only in the process by the variable length coder 211 shown in FIG. 2, and thus a description is given of the operation by the variable length coder 211 in the coding process below with reference to FIG. 8.

In the flow of FIG. 8(a), steps 801 through 805 are performed in the same manner as steps 101 through 105 of the first embodiment. In the third embodiment, in the transformation process in step 806, a first transformed input event is obtained by transformation process using a prescribed function. Here, the transformation process is performed in the same manner as in the first embodiment, and a first transformed input event is obtained by deducting a prescribed Offset from a Level value included in an input event. In this case, the maximum Level value corresponding to each set of (Last, Run) available in the variable length code table shown in FIGS. 19 to 22 is used as an Offset: for example, Offset=12 for (Last, Run)=(0, 0), Offset=6 for (Last, Run)=(0, 1), and Offset=4 for (Last, Run)=(0, 2).

In step 807, comparison is performed between a first transformed input event and a reference event included in the variable length code table, and in step 808, decision is made based on the comparison. If it is decided in step 810 that a matching reference event is found, step 810 is performed, and if not found, the procedure shown in FIG. 8(b) is performed. When step 810 is performed, a result of coding is output which is a variable length code corresponding to the reference event to which a control code set uniquely in advance and a second mode code are added, followed by step 811. Here, "0000011", which is identical to the ESC code shown in FIG. 22, is used as a control code, and "0" is used as a second mode code.

On the other hand, when the procedure shown in FIG. 8(b) is performed, a Run of an input event is transformed using a prescribed function to derive a second transformed input event. In the third embodiment, a prescribed value Offset is deducted from a Run value to generate a second transformed input event having a new Run value. In this case, the maximum Run value corresponding to each set of (Last, Level) in the variable length code table is used as an Offset.

In step 822, comparison is performed between the second transformed input event and a reference event included in the variable length code table, and in step 823, decision is made based on the comparison. If it is decided that a matching reference event is found, step 824 is performed; if it is not found, step 825 is performed. If step 824 is performed at this point, a result of coding is output which is a variable length code corresponding to the reference event to which a control code and a third mode code are added, followed by step 811 shown in FIG. 8(a). The third mode code is set to "10".

On the other hand, if step 825 is performed, the coding process shown in FIG. 23 is performed to an input event to generate a fixed length code. Then, a result of coding is output which is the fixed length code to which a control code and a first mode code are added. The first mode code is set to "11".

If any step is performed from among step 810 and steps 824 and 825 shown in FIG. 8(b), in a subsequent step 811, it is decided whether an input event processed is a last input event or not, and if the event is the last one, the coding process is completed in step 812. On the other hand, if it is not the last one, the operation is returned to step 802 after j is incremented by 1 in step 813, whereby a next input event is processed similarly. Thus, the process is continued to the last non-zero coefficient.

Hereinafter a description is given of a decoding process to the coded data obtained in the image coding process shown in the third embodiment. The configuration of an image decoding apparatus according to the third embodiment is identical to that of the image decoding apparatus of the first embodiment, and thus FIG. 4 will be used for the description.

Figure 9:
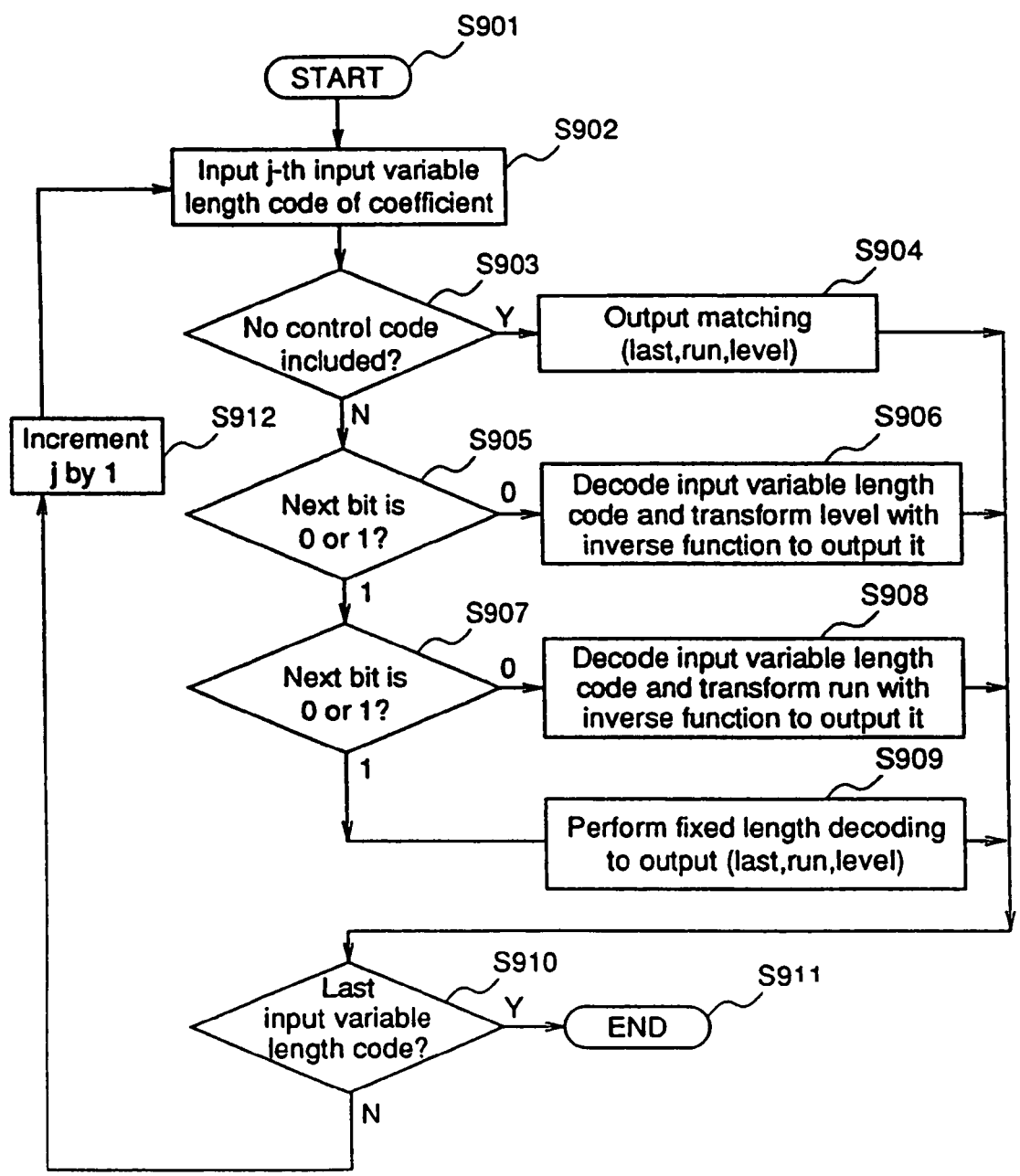
FIG. 9 is a flowchart illustrating the procedure of a variable length decoding method according to the same embodiment.

FIG. 9 is a flowchart showing the procedure of a variable length decoding method according to the third embodiment. An image decoding process according to the third embodiment differs from that of the first embodiment only in the process by the variable length decoder 408 shown in FIG. 4, and thus a description is given of the operation by the variable length decoder 408 in the decoding process with reference to FIG. 9.

Steps 901 through 906 are performed in the same manner as steps 701 through 706 of the second embodiment shown in FIG. 7. When it is decided in step 905 that a target bit is "1", step 907 is performed in which decision process is performed to know whether the subsequent one bit is "0" or "1". Then, if it is "0", step 908 is performed, and if it is "1", step 909 is performed.

If step 908 is performed, a set of (Last, Run, Level) corresponding to an input variable length code is obtained using a variable length code table, and to a Run value thereof, transformation process is performed using a prescribed function, and then the result of decoding is output. In the transformation process according to the third embodiment, a prescribed (Offset+1) is added to a resultant Run value.

On the other hand, if step 909 is performed, an input variable length code is decoded as a fixed length code to regenerate coefficients. If any of steps 904, 906, 908, and 909 is performed, in a subsequent step 910, it is decided whether an input variable length code is a last input variable length code or not; if it is the last one, the coding process is completed in step 911. On the other hand, if it is not the last one, the operation is returned to step 902 after j is incremented by 1 in step 912, whereby a next input variable length code is performed in the same manner. Thus, the process is continued to the last variable length code.

As described above, in the image coding method according to the third embodiment, if a reference event concerned is not found in a variable length code table in the comparison process in steps 803 through 804 as shown in FIG. 8(a), transformation process is performed to an input event in step 806, and comparison process is performed using a resultant first transformed input event in steps 807 through 808; if a matching reference event is not found in the variable length code table at this time, the process shown in FIG. 8(b) is performed in which transformation process is performed to an input event in step 821, and in steps 822 through 823, comparison process is performed using a resultant second transformed input event; therefore, by performing step 825, a rate of performing fixed length coding is further reduced in comparison with the respective rates of the first and second embodiments, and a possibility that short codes are allocated in variable length coding is further increased, resulting in improved total compression ratio of a result of coding.

Further, since the image coding apparatus of the third embodiment comprises a variable length coder 211 performing the above-described coding method, a result of coding having an improved compression ratio can be obtained by using a single variable length code table whether the compression ratio of the compression coding in the coder 203 is high or low.

Furthermore, according to the image decoding method and image decoding apparatus of the third embodiment, appropriate decoding process can be performed corresponding to the result of coding derived in the above-described manner, to obtain reconstructed image.

Embodiment 4

An image coding method according to a fourth embodiment of the present invention is intended for increasing a chance of using variable length code table by a comparison process using plural variable length code tables, thereby improving coding efficiency.

Figure 10:
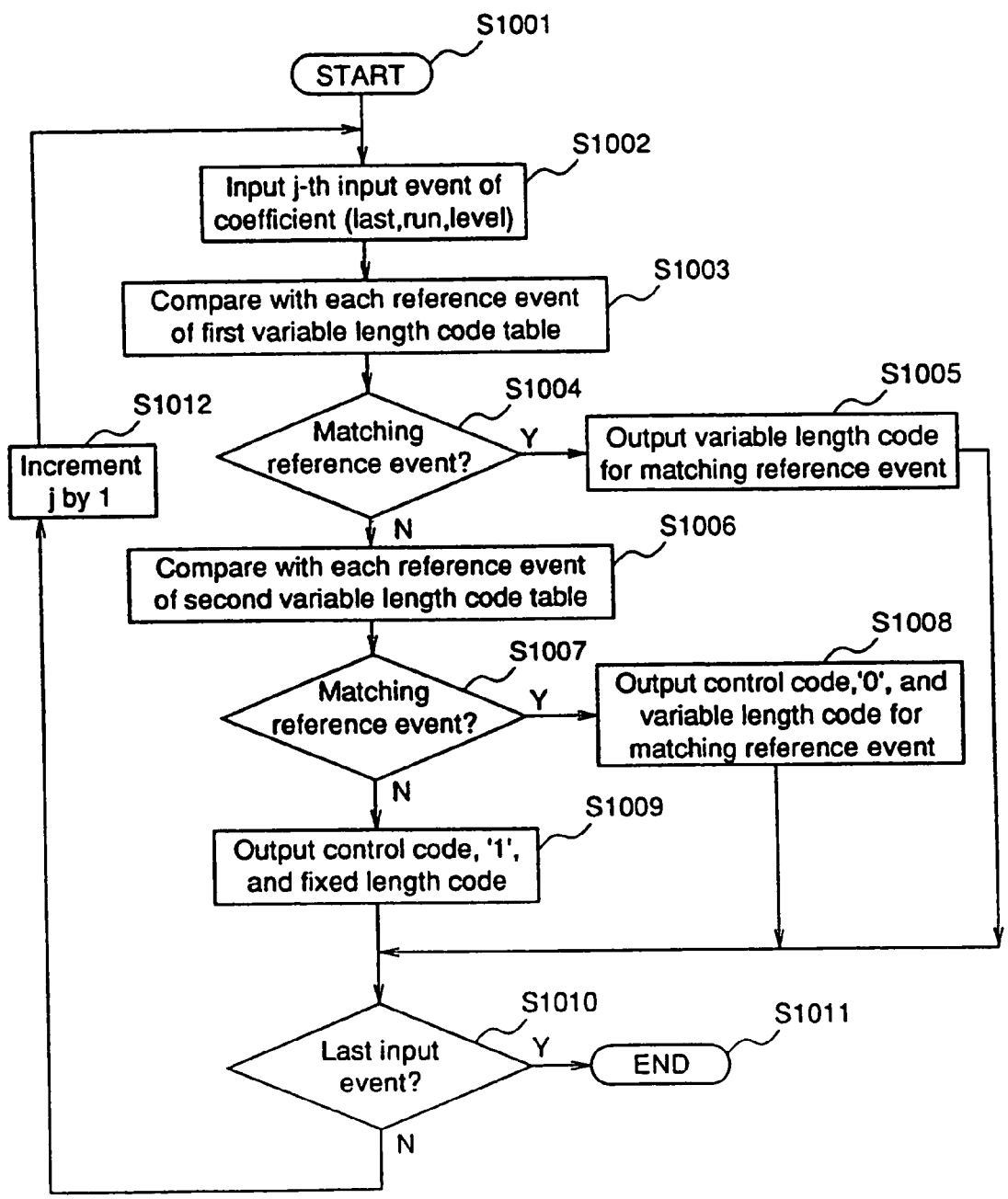
FIG. 10 is a flowchart illustrating the procedure of a variable length coding method according to a fourth embodiment of the present invention.

FIG. 10 is a flowchart showing the procedure of a variable length coding method according to the fourth embodiment. An image coding apparatus of the fourth embodiment has the same configuration as that of the first embodiment, and thus FIG. 2 will be used for the description.

An image coding process according to the fourth embodiment differs from that of the first embodiment only in the process by the variable length coder 211 shown in FIG. 2, and thus a description is given of the operation by the variable length coder 211 in the coding process below with reference to FIG. 10. Here, first and second variable length code tables are used in the coding process according to the fourth embodiment. As for the first variable length code table, the tables shown in FIGS. 19 through 22 are used as in the first to third embodiments. As for the second variable length code table, on the other hand, a table different from the first variable length code table is used, and in this case, used is the one composed of the sets having Level values no less than ten. As described above, in the fourth embodiment, a first variable length code table in which most of Level values are less than ten is used, whereas a second variable length code table is used including the Level values equal to or more than ten; that is, it is preferable to use a second variable length table composed of the reference events not included in the first variable length table.

Following the initiation of the process in step 1001, a j-th input event is derived in step 1002. In step 1003, comparison is performed between the input event and a reference event included in a first variable length code table in the variable length coder 211. Next, in step 1004, it is decided whether a reference event having a matching set of (Last, Run, Level) is found or not in the comparison process. If it is decided in step 1004 that such reference event is found, step 1005 is performed; if it is not found, step 1006 is performed. If step 1005 is performed at this point, a variable length code corresponding to the reference event is output, followed by step 1010 which will be described.

If step 1006 is performed, on the other hand, comparison is performed between the input event and a reference event included in a second variable length code table. Then, in step 1007, it is decided whether a reference event having matching (Last, Run, Level) is found or not in the comparison process. If it is decided in step 1007 that the reference event is found, step 1008 is performed, and if it is not found, step 1009 is performed. If step 1008 is performed at this point, a variable length code corresponding to the reference event is obtained, and a control code set uniquely and a second mode code are added to the code and output, followed by step 1010 which will be described later. In this case, "0000011", which is identical to the ESC code shown in FIG. 22, is used as a control code, and "0" is used as a second mode code.

If step 1009 is performed, on the other hand, the coding process shown in FIG. 23 is performed to an input event to generate a fixed length code. Then, a result of coding is output which is the fixed length code to which a control code and a first mode code are added. "1" is used as a first mode code.

If any of steps 1005, 1008, and 1009 is performed, in a subsequent step 1010, it is decided whether an input event processed is a last input event or not, and if it is the last one, the coding process is completed in step 1011. On the other hand, if it is not the last one, the operation is returned to step 1002 after j is incremented by 1 in step 1012, whereby a next input event is performed in the same manner. Thus, the process is continued to the last non-zero coefficient.

Hereinafter a description is given of a decoding process to the coded data obtained in the image coding process shown in the fourth embodiment. The configuration of an image decoding apparatus according to the fourth embodiment is identical to that of the first embodiment, and thus FIG. 4 will be used for the description.

Figure 11:
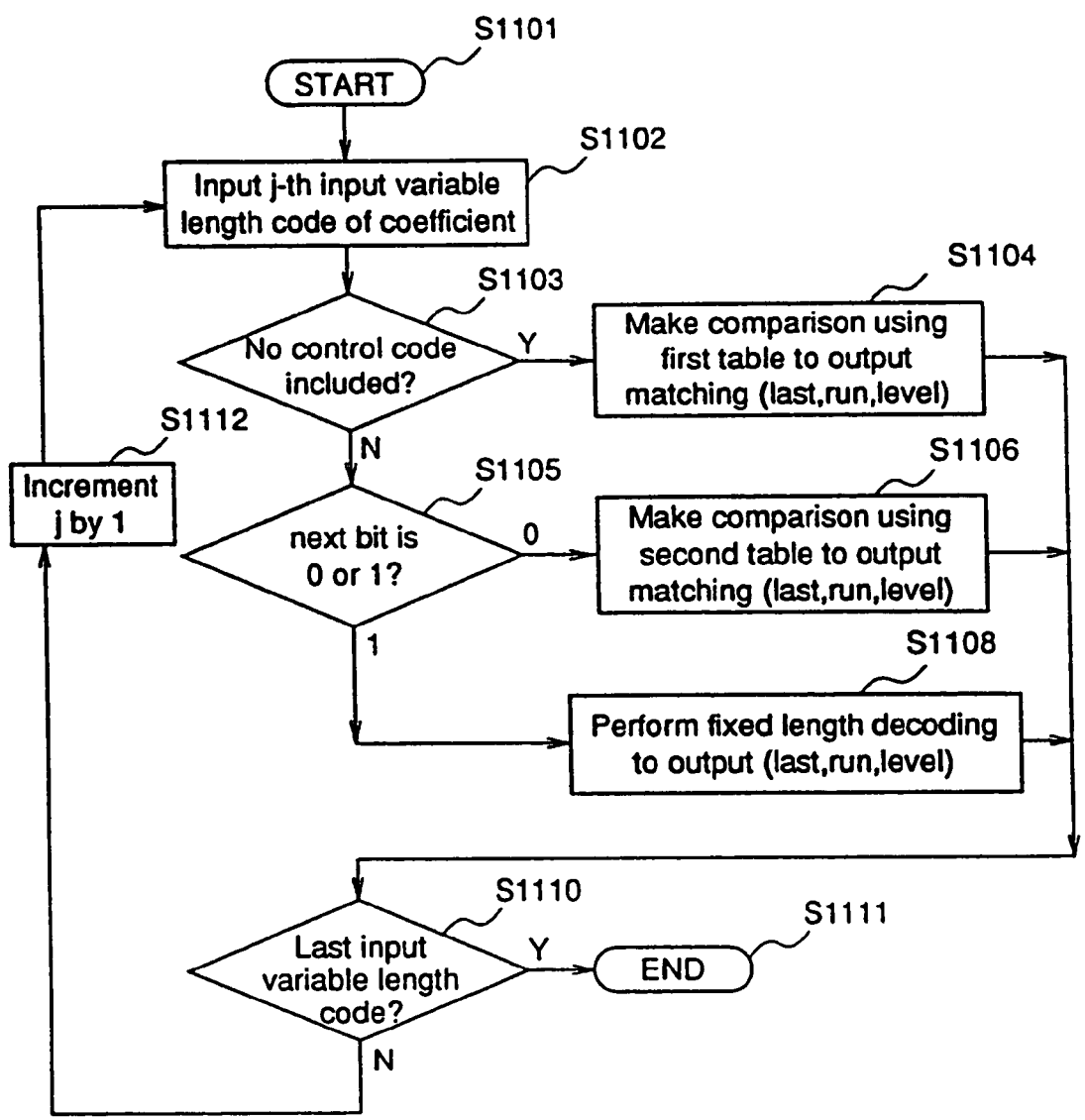
FIG. 11 is a flowchart illustrating the procedure of a variable length decoding method according to the same embodiment.

FIG. 11 is a flowchart showing the procedure of a variable length decoding method according to the fourth embodiment. An image decoding process according to the fourth embodiment differs from that of the first embodiment only in the process by the variable length decoder 408 shown in FIG. 4, and thus the operation by the variable length decoder 408 in the decoding process will be described with reference to FIG. 11.

First of all, following the initiation of the process in step 1101, a variable length code of quantized transformed coefficients, which is a j-th object to be processed, is input as an input variable length code. In step 1103, it is decided whether the input variable length code includes a control code or not; if the control code is not included, step 1104 is performed, and if it is included, step 1105 is performed. In the case where step 1104 is performed, that is, in the case where a control code is not included, a set of (Last, Run, Level) corresponding to the input variable length code is output by using a first variable length code table, followed by step 1110 which will be described later.

When it is decided in step 1103 that the control code is included, decision process is performed in step 1105 to know whether a next one bit subsequent to the control code is "0" or "1". Then, if it is "0", step 1106 is performed, whereas step 1108 is performed if it is "1".

If step 1106 is performed, a set of (Last, Run, Level) corresponding to the input variable length code is output by using the second variable length code table, followed by step 1110 which will be described later. If step 1108 is performed, on the other hand, decoding is performed to the input variable length code as a fixed length code to regenerate the coefficients.

If any of steps 1104, 1106, and 1108 is performed, in a subsequent step 1110, it is decided whether an input variable length code processed is a last input variable length code or not, and if it is the last one, the coding process is completed in step 1111. On the other hand, if it is not the last one, the operation is returned to step 1102 after j is incremented by 1 in step 1112, whereby a next input variable length code is processed similarly. Thus, the process is continued to the last variable length code.

As described above, in the image coding method in accordance with the fourth embodiment, first and second variable length code tables are used, and if a reference event concerned is not found in the first variable length code table in a comparison process in steps 1003 through 1004, a comparison process can be performed with the second variable length code table; therefore, a rate of performing fixed length coding in step 1009 is reduced, resulting in improved whole compression ratio of a result of coding. According to the fourth embodiment, a plurality of variable length code tables have to be prepared, and by forming plural tables so that the events included in one of the tables are different from those in the other tables, coding efficiency can be improved.

Further, since the image coding apparatus of the fourth embodiment comprises a variable length coder 211 performing the above-described coding method, it is possible to obtain a result of coding having improved compression ratio whether the compression ratio of the compression coding by the coder 203 is high or low.

Furthermore, according to the image decoding method and image decoding apparatus of the fourth embodiment, appropriate decoding process can be performed corresponding to a result of coding deprived in the above-described manner to obtain reconstructed image.

Although in the fourth embodiment two variable length code tables are used, an arbitrary number of variable length code tables may be prepared, and a corresponding number of mode codes may be used to distinguish the plural variable length code tables. Further, it is possible to distinguish plural variable length code tables by quantization scales.

Embodiment 5

In an image coding method according to a fifth embodiment of the present invention, a transformation process using division process is performed to an event which is an object to be coded, and then comparison is performed with a variable length code table.

Figure 12:
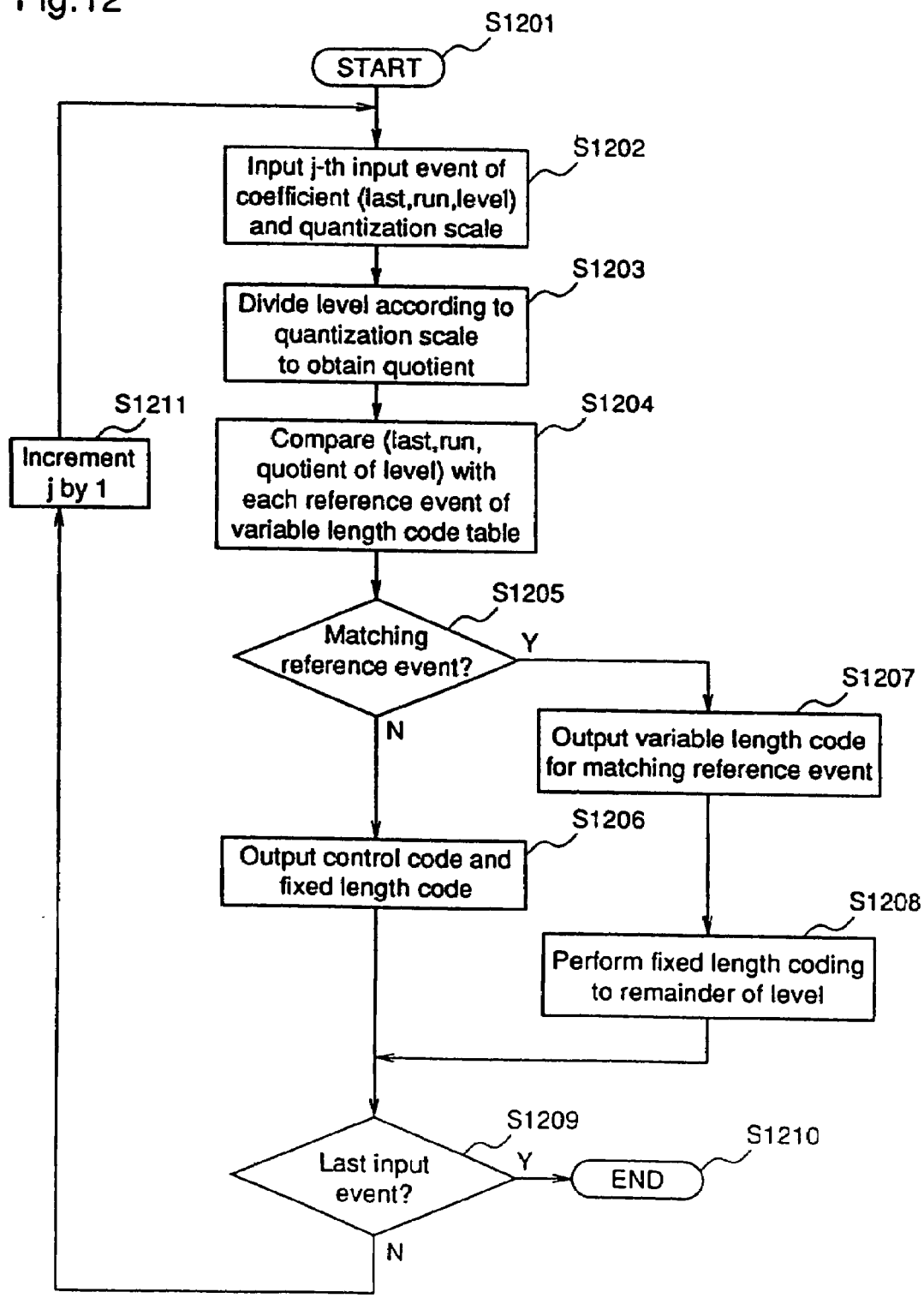
FIG. 12 is a flowchart showing the procedure of a variable length coding method according to a fifth embodiment of the present invention.

FIG. 12 is a flowchart of the procedure of a variable length coding method according to the fifth embodiment. An image coding apparatus according to the fifth embodiment has the same configuration as that of the first embodiment, and thus FIG. 2 will be used for the description.

An image coding process according to the fifth embodiment differs from that according to the first embodiment only in the process by the variable length coder 211 shown in FIG. 2, and thus a description is given of the operation of the variable length coder 211 in the coding process below with reference to FIG. 12. Following the initiation of the process in step 1201, a j-th input event consisting of (Last, Run, Level) is obtained instep 1202. Then, in step 1203, transformation process is performed to the input event using division process. In the transformation process, division is performed to the Level value included in an input event, using a divisor decided based on a quantization scale, to derive a quotient of the Level. FIG. 13 are diagrams illustrating relations between quantization scale and divisor. FIG. 13(a) shows an example of setting with respect to the relation between them, and indicates that a divisor is set to 2 when a quantization scale ranges from 1 to 7, and a divisor is 1 when a quantization scale is identical to or more than 8. This means that if a quantization scale is equal to or more than 8, division is not carried out. FIG. 13(b) shows another example of setting with respect to the relation between them, and as shown in the figure, it is possible to classify quantization scales into three classes and decide a divisor corresponding to each class.

Quantization process is basically a division process, and quantized transform coefficients tend to have a large value as a quantization scale decreases; accordingly, when an event is generated, the Level value included in the event is often large. The variable length code table shown in FIGS. 19 through 22 is formed so that it is suitable for the coefficients having a relatively high compression ratio, and includes many events having small Level values; therefore, a matching rate for the reference events included in the table is reduced and a rate of performing variable length coding is also reduced, resulting in degraded coding efficiency. Therefore, in the fifth embodiment, when the quantization scale is small, division is performed to a Level to generate a transformed input event having a small Level value which is used for comparison process, thereby improving a rate of performing variable length coding and increasing a possibility that short codes are allocated.

After the quotient of the Level is derived, in step 1204, comparison is performed between (Last, Run, quotient of Level) of the transformed input event and a reference event included in a variable length code table, and in a subsequent step 1205, decision process is carried out according to the result of the comparison. If it is decided in step 1205 that such reference event is found, step 1206 is performed; if it is not found, step 1208 is performed.

If step 1207 is performed, the variable length code for the reference event concerned is output, and in a subsequent step 1208, the remainder of the Level is subjected to fixed length coding and the result of the coding is output as an input auxiliary code. The code length of the remainder of the Level is changed depending on a divisor. For example, in the case of the setting shown in FIG. 13(a), the bit length of a remainder is set to 1 when a divisor is 2, and the bit length of the remainder is set to 0 when the divisor is 1. In other words, when a divisor is 1, a remainder is actually not coded. If steps 1207 through 1208 are performed, a variable length code and an input auxiliary code are output as the results of coding.

On the other hand, if step 1206 is performed, fixed length coding process is performed to an input event to generate a fixed length code. Then, the result of the coding is output which is the fixed length code to which a control code is added.

After performing steps 1207 through 1208 or step 1206, in a subsequent step 1209, it is decided whether an input event processed is the last input event or not, and if it is the last one, the coding process is completed in step 1210. On the other hand, if it is not the last one, the operation is returned to step 1202 after j is incremented by 1 in step 1211, whereby a next input event is performed in the same manner. Thus, the process is continued to the last non-zero coefficient. Hereinafter a description is given of a decoding process to the coded data obtained by the image coding process shown in the fifth embodiment. The configuration of an image decoding apparatus according to the fifth embodiment is identical to that of the first embodiment, and thus FIG. 4 will be used for the description.

Figure 14:
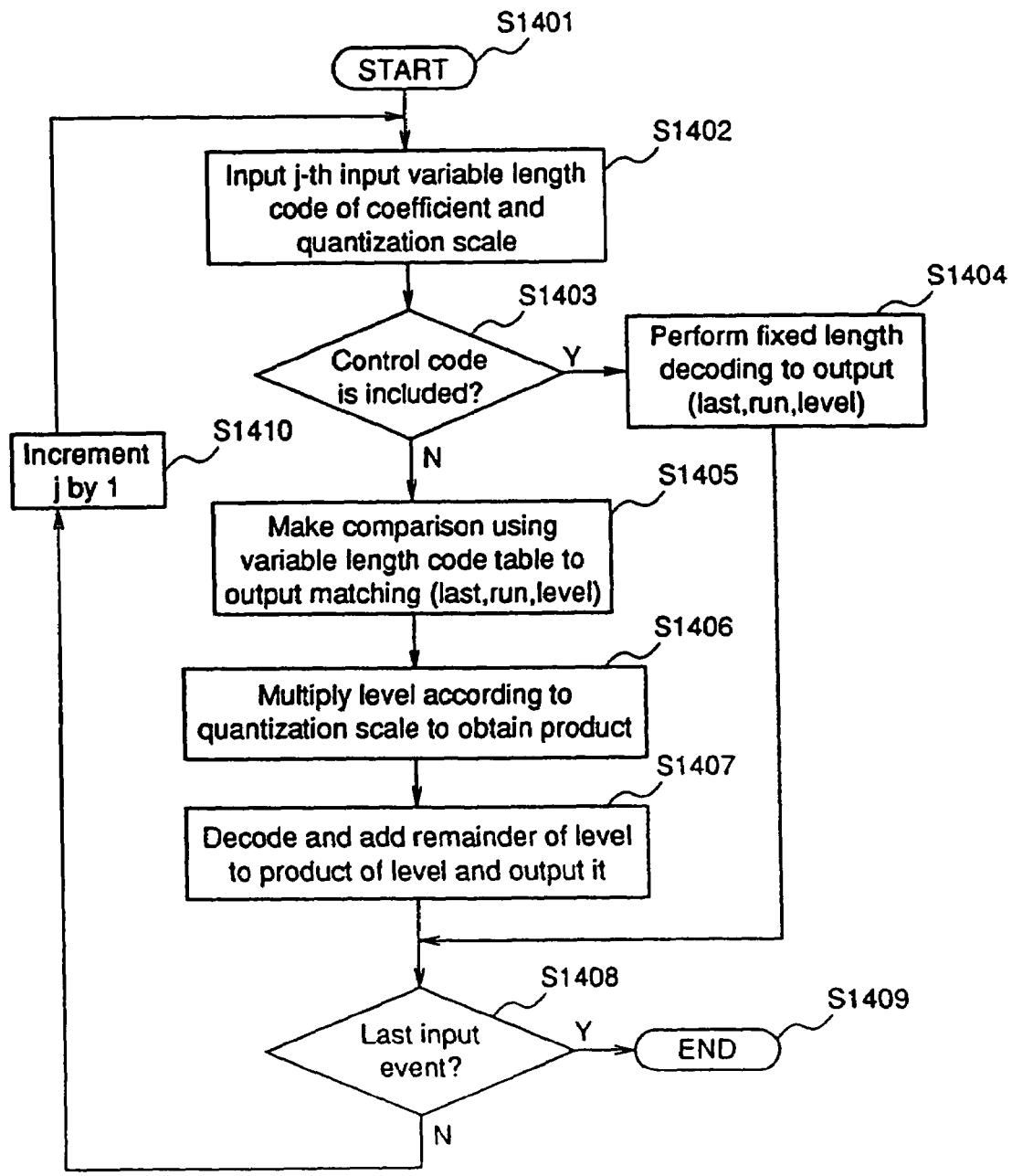
FIG. 14 is a flowchart illustrating the procedure of a variable length decoding method according to the same embodiment.

FIG. 14 is a flowchart showing the procedure of a variable length decoding method according to the fifth embodiment. An image decoding process according to the fifth embodiment differs from that of the first embodiment only in the process by the variable length decoder 408 shown in FIG. 4, and thus a description is given of the operation by the variable length decoder 408 in the decoding process below with reference to FIG. 14.

First of all, following the initiation of the process in step 1401, a variable length code of quantized transform coefficients, which is a j-th object to be processed, is input as an input variable length code in step 1402. Since the result of coding including an input auxiliary code is obtained as described in the image coding process of the fifth embodiment, the input auxiliary code is also input together with the variable length code as an object to be processed at this point. In step 1403, it is decided whether the input variable length code includes a control code or not; if it is included, step 1404 is performed, and if it is not included, step 1405 is performed. In the case where step 1404 is performed, that is, in the case where the control code is included, the input variable length code is decoded as a fixed length code to regenerate and output coefficients, followed by a subsequent step 1408 which will be described.

On the other hand, in the case where step 1405 is performed, that is, in the case where the control code is not included, a set of (Last, Run, Level) corresponding to the input variable length code is derived by using a first variable length code table, and then step 1406 is performed in which transformation process is performed by multiplying the derived Level value with a prescribed value. The prescribed value is decided based on a quantization scale, and in this case, the value shown in FIG. 13 is used corresponding to the coding process. Then, in step 1407, the input auxiliary code is subjected to fixed length decoding to obtain a remainder of the Level, and the remainder is added to a product derived from the transformation process in step 1406 to obtain a correct Level value, and the set of (Last, Run, Level) in which this Level value is used is output as the result of decoding.

After performance of step 1404 or steps 1405 through 1407, in a subsequent step 1408, it is decided whether an input variable length code processed is a last input variable length code or not; if it is the last one, the coding process is completed in step 1409. On the other hand, if it is not the last one, the operation is returned to step 1402 after j is incremented by 1 in step 1410, whereby a next input variable length code is processed in the same manner. Thus, the process is continued to the last variable length code.

As described above, in the image coding method according to the fifth embodiment, as shown in step 1203 of FIG. 12, transformation process is performed in which division is performed to the Level value included in an input event which is an object to be processed, using a number decided based on a quantization scale, and in step 1204, comparison process is performed using a transformed input event which has been subjected to the transformation process; therefore, a matching rate for reference events included in a variable length code table is increased and a rate of performing fixed length coding in step 1206 is reduced, and a possibility that short codes are allocated in variable length coding is increased as well by using a variable length code, resulting in improved coding efficiency.

Further, since the image coding apparatus of the fifth embodiment comprises a variable length coder 211 performing the above-described coding method, it is possible to obtain a result of coding having improved compression ratio by using a single variable length code table whether the compression ratio of the compression coding by the coder 203 is high or low.

Furthermore, according to the image decoding method and image decoding apparatus of the fifth embodiment, appropriate decoding process can be performed corresponding to the result of coding derived in the above-described manner to obtain reconstructed image.

Although in the fifth embodiment it is described that transformation process is performed to Level included in an event, the transformation process may be performed to Run in place of Level.

Embodiment 6

In an image coding method according to a sixth embodiment of the present invention, in place of an input event, transformation process is performed to a reference event, and then comparison is performed.

Figure 15:
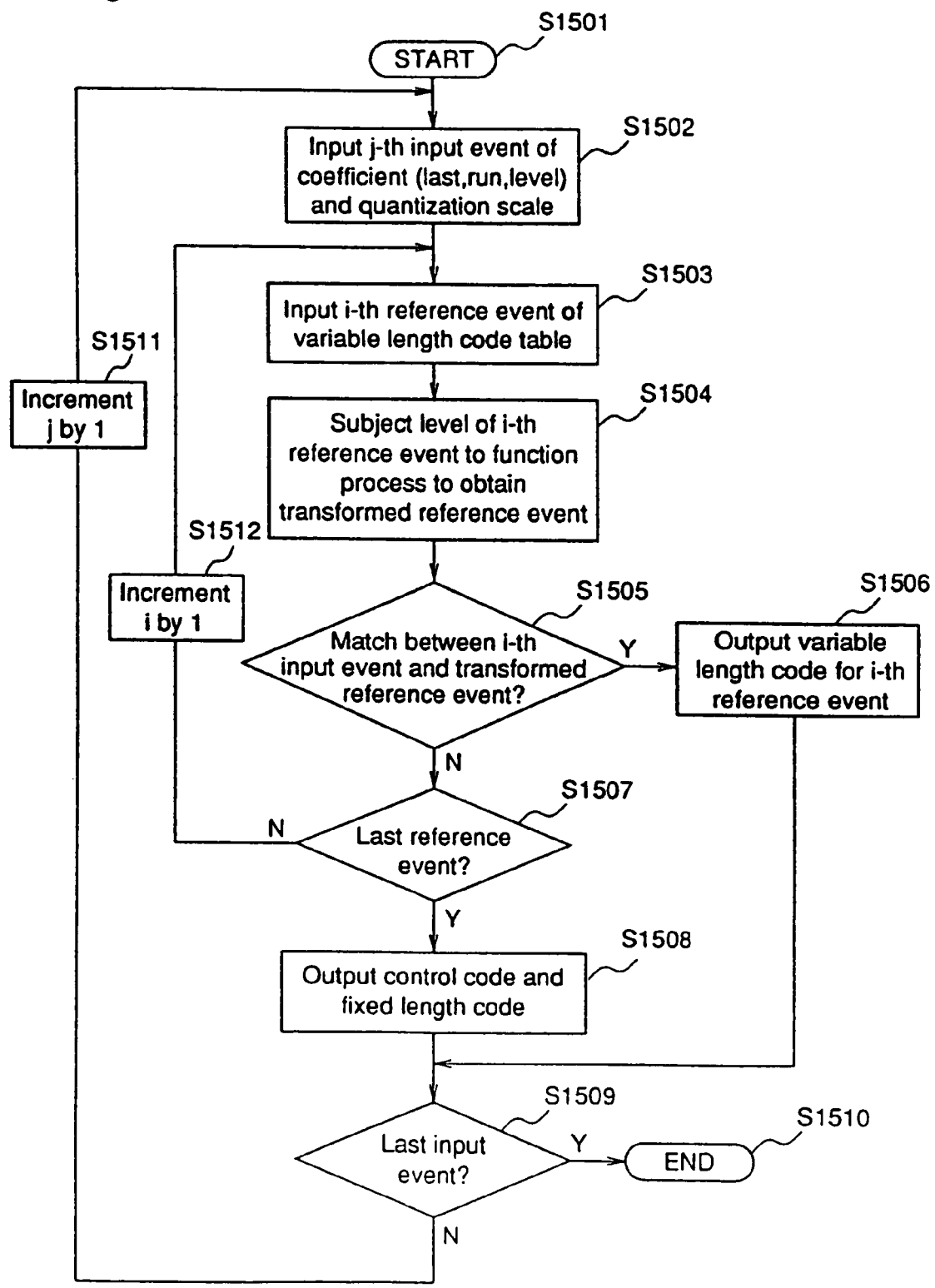
FIG. 15 is a flowchart illustrating the procedure of a variable length coding method according to a sixth embodiment of the present invention.

FIG. 15 is a flowchart showing the procedure of a variable length coding method according to the sixth embodiment. An image coding apparatus according to the sixth embodiment also has the same configuration as that of the first embodiment, and thus FIG. 2 will be used for the description.

An image coding process according to the sixth embodiment differs from that of the first embodiment only in the process by the variable length coder 211 shown in FIG. 2, and thus a description is given of the operation by the variable length coder 211 in the coding process below with reference to FIG. 15. Following the initiation of the process in step 1501, in step 1502, a j-th input event consisting of (Last, Run, Level) is obtained. A quantization scale used in quantization process is also input. In step 1503, an i-th reference event is taken from a variable length code table, and in step 1504, the reference event is subjected to transformation process to generate a transformed reference event.

In the sixth embodiment, as the transformation process, an Offset, which is set according to the quantization scale input in step 1502, is added to a Level value included in a reference event. In this case, setting is performed in such a way that Offset=5 when quantization scale is 1 or 2, Offset=4 when quantization scale is 3 or 4, Offset=3 when quantization scale is 5 or 6, Offset=2 when quantization scale is 7 or 8, Offset=1 when quantization scale is 9 or 10, and Offset=0 when quantization scale is equal to or more than 11. For example, in the case where an event as an object to be coded is (Last, Run, Level)=(0, 1, 6), if transformation process to reference event is not performed, this means that a matching reference event is found in the reference events shown in FIG. 19; a code corresponding to it is used, and the result of coding obtained is 13 bits. On the other hand, in the case where quantization scale is 4 and the same event is used as the object, a transformation process in which 4 is added to the Level value is performed to all of the reference events; a variable length code corresponding to the reference event (0, 1, 2) shown in FIG. 19 is used and thus 7 bits are obtained, which means that 6 bits are saved in comparison with the case in which the above-described transformation process is not performed. Therefore, adding an Offset to the Level of a reference event is identical to a method of deducting an Offset from the Level of an event (Last, Run, Level) which is an object to be coded and comparing it with each set of a variable length code table.

As described in the fifth embodiment, since a value of a quantized coefficient tends to increase as a quantization scale decreases, a frequency at which an event having a large Level value appears is also increased. On the other hand, the variable length code table shown in FIGS. 19 through 22 is suitable for coefficients having a high compression ratio, and include-many events having small Level values. Therefore, adding an Offset to a Level value included in a reference event can raise a rate of performing variable length coding using short codes, thereby improving the compression ratio.

In step 1505, decision process is performed based on the result of the comparison in step 1504. If the decision in step 1505 shows a match, step 1507 is carried out after the performance of step 1506, where a variable length code corresponding to the i-th reference event is output, followed by step 1509 which will be described later. On the other hand, if no match is found, step 1507 is performed.

In step 1507, it is decided whether the i-th reference event is a last reference event included in the variable length cod table; if it is the last reference event, step 1508 is performed. If it is not the last reference event, the operation is returned to step 1503 after i is incremented by 1 in step 1512, and the following steps ending with the decision in step 1507 are performed again.

By the processes in steps 1503 through 1507, the comparison between a j-th input event and a reference event included in the variable length code table is repeated until the decision in step 1505 shows a match between them or it is decided in step 1507 that the treated event is the last one. In other words, the comparison is continued until variable length coding is performed or the last one of the variable length code table is compared.

In the case where it is decided in step 1507 that the treated event is the last one, that is, in the case where the comparison using the table is completed for the j-th input event, it is found that variable length coding cannot be performed and in step 1508, fixed length coding is performed to the input event to output the result of the coding with a control code, followed by step 1509.

In step 1509 performed subsequent to step 1506 or step 1508, it is decided whether an input event processed is a last input event or not; if it is the last one, the coding process is completed in step 1510. If it is not the last one, on the other hand, the operation is returned to step 1502 after j is incremented by 1 in step 1511, whereby a next input event is processed in the same manner. Thus, the process is continued to the last non-zero coefficient.

Figure 16:
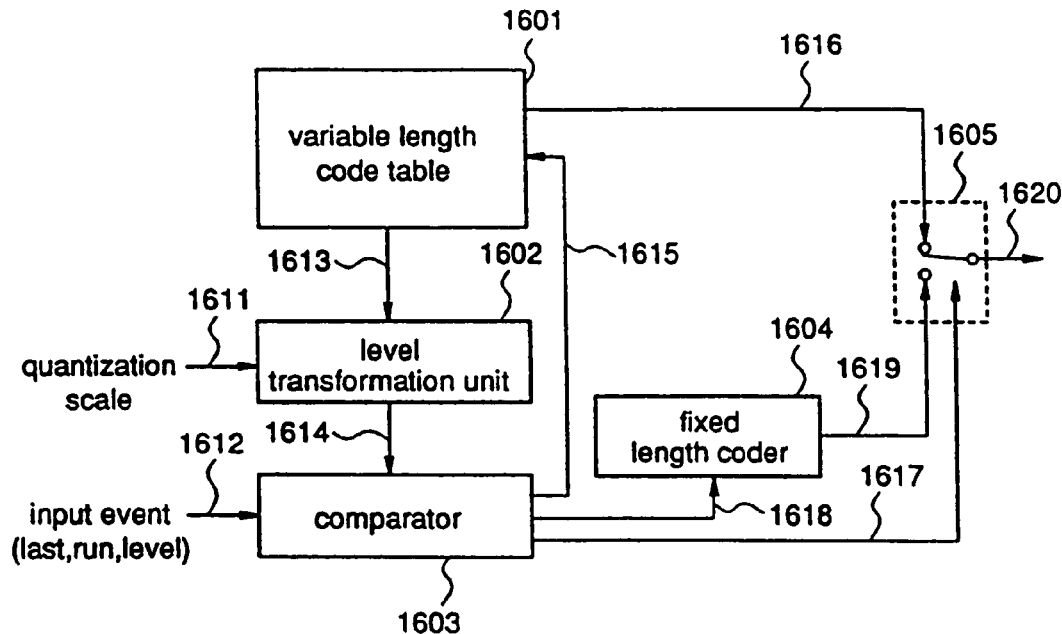
FIG. 16 is a block diagram illustrating the inner configuration of a variable length coder included in the image coding apparatus according to the same embodiment.

FIG. 16 is a block diagram illustrating the inner configuration of the variable length coder (211 in FIG. 2) used in an image coding apparatus according to the sixth embodiment of the present invention. As shown in the figure, the variable length coder comprises: a variable length code table 1601, a Level transformation unit 1602, a comparator 1603, a fixed length coder 1604, and a switch 1605, and receives an input event and a quantization scale as inputs and outputs a result of coding.

The variable length code table 1601 is shown in FIGS. 19 through 22. The Level transformation unit 1602 receives a quantization scale and a reference event as inputs and transforms a Level value of the reference event corresponding to the quantization scale to generate a transformed reference event. The comparator 1603 performs comparison process between an input event and the transformed reference event and outputs a control signal according to the result of the comparison. The fixed length coder 1604 performs fixed length coding process to an input event when it is input, and outputs the result of the coding. The switch 1605 performs switching according to an output from the comparator 1603 and outputs, as a result of coding, one of an output from the variable length code table 1601 and an output from the fixed length coder 1604.

Hereinafter a description is given of the operation of the variable length coder thus constructed, corresponding to the flow of FIG. 15. In step 1502 of the flow of FIG. 15, when a quantization scale and an input event (a j-th one) are input to the variable length coder (211 in FIG. 2), the quantization scale is input to the Level transformation unit 1602 through a line 1611 and the input event is input to the comparator 1603 through a line 1612. In step 1503 of the flow of FIG. 15, the Level transformation unit 1602 derives a reference event (an i-th one) from the variable length code table through a line 1613, performs transformation process to the Level value included in the reference event using the input quantization scale, and outputs a resultant transformed reference event to the comparator 1603.

In step 1505 of the flow of FIG. 15, comparison process and decision process are performed by the comparator 1603. The comparator 1603 performs comparison process between the input event and the transformed reference event which are input, and decides whether these events match or not. If the decision is "matching", the comparator 1603 sends a control signal to the variable length code table 1601 through a line 1615 so that a code corresponding to the i-th reference event is output, while sending a control signal to the switch 1605 through a line 1617 so that the output from the variable length code table 1601 is output from the switch 1605. Therefore, if the decision in step 1505 shows "matching", in step 1506 of the flow of FIG. 15, a variable length code is output from the output line 1620 of the switch 1605.

On the other hand, if it is found in the comparison process by the comparator 1603 that those events do not match, a next reference event (i+1-th one) is input from the variable length code table 1601 to the Level transformation unit 1602, in response to a control signal through the line 1615. In the flow of FIG. 15, the steps starting with step 1503 are performed again after "i" is incremented in step 1512.

When it is checked from the decision in step 1507 that the comparison process is completed for the last one of the variable length code table, the comparator 1603 outputs the input event (the j-th one) to the fixed length coder 1604 through a line 1618, while sending a control signal to the switch 1605 through a line 1617 so that the output from the fixed length coder 1604 is used as a code from the switch 1605.

In 1508 of the flow of FIG. 15, the fixed length coder 1604 performs coding process to the input event input and outputs an obtained result of coding to the switch 1605 through a line 1619. According to the control signal from the comparator 1603, a fixed length code is output from the switch 1605 through the line 1620.

Following the output from the line 1620, a next input event is input through the line 1612, whereby the processes to input event in the flow of FIG. 15 is executed again.

The image coding according to the sixth embodiment of the present invention is thus performed, whereas a decoding process to the coded data obtained by such image coding is performed in an image decoding apparatus shown in FIG. 4. An image decoding process according to the sixth embodiment differs from that of the first embodiment only in the process by the variable length decoder 408 shown in FIG. 4, and thus a description is given of the decoding process by the variable length decoder 408 below, with reference to FIG. 17 showing the inner configuration thereof.

Figure 17:
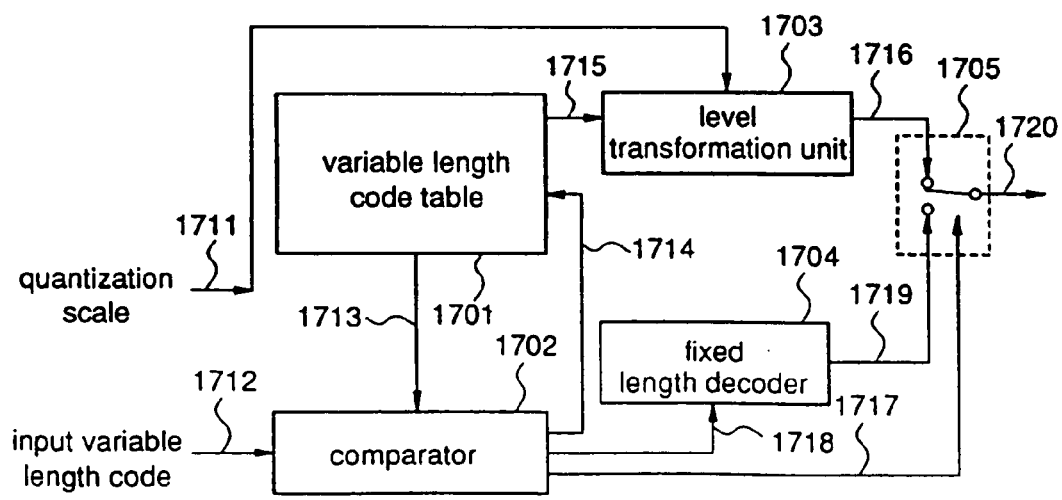
FIG. 17 is a block diagram illustrating the inner configuration of a variable length decoder included in the image decoding apparatus according to the same embodiment.

As shown in FIG. 17, the variable length decoder comprises: a variable length code table 1701, a comparator 1702, a Level inverse transformation unit 1703, a fixed length decoder 1704, and a switch 1705, and it receives an input variable length code and a quantization scale as inputs and outputs a result of regeneration derived from the decoding process.

The variable length code table 1071 is shown in FIGS. 19 through 22. The comparator 1702 performs comparison process between an input variable length code and a reference variable length code and outputs a control signal corresponding to the result of comparison. The Level inverse transformation unit 1703 receives a quantization scale and a reference event as inputs, transforms a value of a Level included in the reference event corresponding to the quantization scale to generate a transformed reference event. The fixed length decoder 1704 performs fixed length decoding process to an input variable length code when it is input and outputs the result of the decoding. The switch 1705 performs switching corresponding to the output from the comparator 1702 and outputs, as a result of regeneration, one of the output from the variable length code table 1701 and the output from the fixed length decoder 1704.

Hereinafter a description is given of the operation of the variable length decoder thus constructed. When a quantization scale and an input variable length code are input to the variable length decoder (408 in FIG. 4), the quantization scale is input to the Level inverse transformation unit 1703 through a line 1711, and the input variable length code is input to the comparator 1702 through a line 1712. The comparator 1702 derives a reference variable length code from the variable length code table 1701 through a line 1713 and performs comparison between the input variable length code and the reference variable length code.

If the result of the comparison is that these codes match, the comparator 1702 sends a control signal to the variable length code table 1701 through a line 1714 so that a reference event corresponding to the reference variable length code is output, while sending a control signal to the switch 1705 through a line 1717 so that the code from the variable length code table 1701 is output from the switch 1705.

From the variable length code table, a reference event is input to the Level inverse transformation unit 1703 through a line 1715 to be subjected to transformation process. The Level inverse transformation unit 1703 performs the inverse of the transformation process performed for coding, corresponding to the Level included in the reference event based on a quantization scale. In the sixth embodiment, an Offset predetermined according to a quantization scale is added to the Level value included in a reference value. This is performed in such a way that Offset=5 when quantization scale is 1 or 2, Offset=4 when quantization scale is 3 or 4, Offset=3 when quantization scale is 5 or 6, Offset=2 when quantization scale is 7 or 8, Offset=1 when quantization scale is 9 or 10, and Offset=0 when quantization scale is equal to or more than 11. For example, when an input variable length code is "0101000", (Last, Run, Level)=(0, 1, 2) is derived as a reference event from a table shown in FIG. 19. The Level inverse transformation unit 1703 adds 4 to the Level included in this reference event input if the input quantization scale is 4, and outputs the obtained result (0, 1, 6) to the switch 1705 through a line 1716. Then, corresponding to the control signal from the comparator 1702, the switch 1705 outputs this result as a result of regeneration through the line 1720.

When the decision shows "matching", a variable length code is output from the output line 1720 of the switch 1705.

On the other hand, when no matching variable length code is found in the comparison process by the comparator 1702, the comparator 1702 outputs the input variable length code to the fixed length decoder 1704 through a line 1718, while sending a control signal to the switch 1705 through the line 1717 so that a code from the fixed length decoder 1704 is output from the switch 1705. Thereby, a result of fixed length decoding is output from the output line 1720 of the switch 1705.

Thus, according to the image coding method according to the sixth embodiment, the transformation process shown in step 1502 of FIG. 15 is performed to a reference event included in a variable length code table; therefore, a rate of performing variable length coding and a rate at which short codes are allocated are increased as in the first embodiment where the same transformation process is performed to input event, resulting in improved coding efficiency.

Further, since the image coding apparatus according to the sixth embodiment comprises a variable length coder 211 having the inner configuration shown in FIG. 16 and implementing the above-described coding method, a result of coding having improved compression ratio can be obtained using a single variable length code table whether the compression ratio of the compression coding by the coder 203 is high or low.

Furthermore, by the image decoding method and image decoding apparatus according to the sixth embodiment, appropriate decoding process can be performed corresponding to the result of coding derived in the above-described manner to obtain a reconstructed image.

Although in the sixth embodiment a method of adding Offset is used as a transformation process to reference event, the process is not limited to this method only and other functions may be applied. For example, the above-described effect can be obtained by the following methods: changing a multiple to a Level value according to a quantization scale; subjecting to quadratic function; and changing a dynamic range of a Level.

Further, as is illustrated in the description of the transformation process to input event in the first embodiment as well as in other embodiments, it is possible to perform transformation process to a value of Run of a reference event, in place of a transformation process to a Level thereof.

As described in the embodiments of the present invention, in any of the embodiments, the procedure presented referring to the flowchart thereof is just one example, and other procedure implementing the same coding and decoding methods may be used.

Furthermore, the image coding apparatuses and image decoding apparatuses of the first through sixth embodiments of the present invention are realized by recording, in recording media, an image coding program implementing the image coding methods of the respective embodiments and an image decoding program implementing the image decoding methods of the respective embodiments, and running the recorded programs on a computer system including a personal computer and a work station. Recording media capable of recording such programs may be employed: for example, floppy disks or optical disks such as CD-ROM.

INDUSTRIAL AVAILABILITY

As described above, the image coding methods and image coding apparatuses of the present invention are able to perform coding process at a high compression ratio to a wide range of objects having various compression ratios, using a single variable length code table, when an object to be processed is the data compression-coded by subjecting digital image data to DCT or waveform coding.

Further, the image decoding methods and image decoding apparatuses of the present invention are able to perform appropriate decoding process to a result of coding which has been subjected to the above-described efficient coding process, to obtain reconstructed images.

Furthermore, a recording medium containing an image coding program and a recording medium containing an image decoding program according to the present invention are able to implement an image coding apparatus capable of obtaining a result of coding with a high compression ratio and an image decoding apparatus capable of appropriately processing the result of coding, utilizing a device resource fully, by running the recorded programs on a computer system.

The invention claimed is:

1. An image decoding method for extracting a variable length code from a compression coded data, obtaining an event corresponding to said variable length code by using a variable length code table wherein a reference event consisting of Last, Run, Level, is assigned to each reference variable length code, and deriving an output transform coefficient from said event, the method comprising:

obtaining an event corresponding to said variable length code by using a variable length code table when said variable length code does not include a control code, obtaining an event corresponding to said variable length code by using said variable length code table and then obtaining a transformed event by transforming the Level value corresponding to said variable length code using a predetermined function when said variable length code includes said control code which is a second control code, and obtaining an event by subjecting said variable length code to fixed length decoding when said variable length code includes said control code that is a first control code.

2. The image decoding method according to claim 1, wherein the predetermined function for transforming the Level value is defined as:

the transformed Level=sign (the resultant Level value)×[abs (the resultant Level value)+a predetermined Offset value].

3. An image decoding method for extracting a variable length code from compression coded data, obtaining an event corresponding to said variable length code by using a variable length code table wherein a reference event comprising Run and Level, is assigned to each reference variable length code, and deriving a transform coefficient corresponding to said event, the method comprising;

obtaining an event corresponding to said variable length code by using said variable length code table when said variable length code does not include a control code, obtaining an event corresponding to said variable length code by using said variable length code table and then obtaining a transformed event by transforming the Level value of said event corresponding to said variable length code using a predetermined function when said variable length code includes said control code which is a second control code, and obtaining an event by subjecting said variable length code to fixed length decoding when said variable length code includes said control code which is a first control code.

4. The image decoding method according to claim 3, wherein the predetermined function for transforming the Level value is defined as:

the transformed Level value=sign (the resultant Level value)×[abs (the resultant Level value)+a predetermined Offset value].

* * * * *